United States Patent
Miyoshi

(10) Patent No.: US 9,449,379 B2
(45) Date of Patent: Sep. 20, 2016

(54) METHOD FOR INSPECTING SOLUTION DISCHARGE APPARATUS AND METHOD FOR PRODUCING DEVICE

(71) Applicant: PANASONIC CORPORATION, Osaka (JP)

(72) Inventor: Takayuki Miyoshi, Hyogo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 114 days.

(21) Appl. No.: 14/388,879

(22) PCT Filed: Jun. 19, 2013

(86) PCT No.: PCT/JP2013/003822
§ 371 (c)(1),
(2) Date: Sep. 29, 2014

(87) PCT Pub. No.: WO2013/190837
PCT Pub. Date: Dec. 27, 2013

(65) Prior Publication Data
US 2015/0056365 A1 Feb. 26, 2015

(30) Foreign Application Priority Data
Jun. 20, 2012 (JP) ................. 2012-138739

(51) Int. Cl.
*B41J 2/21* (2006.01)
*G06T 7/00* (2006.01)
*H01L 51/00* (2006.01)

(52) U.S. Cl.
CPC ............ *G06T 7/0004* (2013.01); *B41J 2/2142* (2013.01); *H01L 51/0005* (2013.01)

(58) Field of Classification Search
CPC ..................... B41J 2/2142; G06T 7/0004
See application file for complete search history.

(56) References Cited

U.S. PATENT DOCUMENTS

| | | | |
|---|---|---|---|
| 5,477,244 A * | 12/1995 | Shibata | B41J 2/01 29/890.1 |
| 2002/0158835 A1 | 10/2002 | Kobayashi et al. | |
| 2010/0253982 A1* | 10/2010 | Kasai | B41J 2/2142 358/3.26 |
| 2012/0133375 A1* | 5/2012 | Akiyama | B41J 2/2142 324/613 |
| 2015/0224802 A1* | 8/2015 | Kawamichi | B41J 29/393 347/14 |

FOREIGN PATENT DOCUMENTS

| | | |
|---|---|---|
| JP | 2002-318556 | 10/2002 |
| JP | 2010-158874 | 7/2010 |
| JP | 2011-000734 | 1/2011 |

OTHER PUBLICATIONS

Search report from PCT/JP2013/003822, mail date is Sep. 24, 2013.

* cited by examiner

*Primary Examiner* — James M Mellott
(74) *Attorney, Agent, or Firm* — Greenblum & Bernstein, P.L.C.

(57) ABSTRACT

A inspection method for a solution discharge device includes a discharge step, a imaging step, an acquisition step, and a judgement step of identifying a main drop among deposits found to have a deposit surface area falling within a deposit surface area standard for each imaging area. An upper bound and a lower bound of the deposit surface area standard are determined according to timing of imaging in the imaging step, such that the values applied to deposits in an imaging area imaged at a second imaging time that is later than a first imaging time are smaller than those applied to deposits in an imaging area imaged at the first imaging time.

7 Claims, 20 Drawing Sheets

FIG. 6A

| Imaging area | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Main drop | ○ | ○ | ○ | ○ | ○ | ○ | ○ | ○ | ○ | ○ | ○ | ○ | ○ | ○ | ○ |
| Area (μm²) | 40 | 125 | 34 | 34 | 32 | 31 | 8 | 29 | 29 | 6 | 27 | 26 | 26 | 26 | 25 |
| Displacement (μm) | 5 | 8 | 6 | 127 | 3 | 9 | 6 | 8 | 7 | 10 | 3 | 11 | 4 | 2 | 8 |

FIG. 6B

| Imaging area | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Main drop | ○ | × | ○ | ○ | ○ | ○ | ○ | ○ | ○ | ○ | ○ | ○ | ○ | ○ | ○ |
| Area (μm²) | 40 | 125 | 34 | 34 | 32 | 31 | 8 | 29 | 29 | 6 | 27 | 26 | 26 | 26 | 25 |
| Displacement (μm) | 5 | 8 | 6 | 127 | 3 | 9 | 6 | 8 | 7 | 10 | 3 | 11 | 4 | 2 | 8 |

FIG. 6C

| Imaging area | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Main drop | ○ | × | ○ | ○ | ○ | ○ | ○ | ○ | ○ | ○ | ○ | ○ | ○ | ○ | ○ |
| Area (μm²) | 40 | 125 | 34 | 34 | 32 | 31 | 8 | 29 | 29 | 6 | 27 | 26 | 26 | 26 | 25 |
| Displacement (μm) | 5 | 8 | 6 | 127 | 3 | 9 | 6 | 8 | 7 | 10 | 3 | 11 | 4 | 2 | 8 |
| Standard value (μm²) | 42 | 37 | 35 | 34 | 32 | 31 | 31 | 30 | 29 | 29 | 28 | 28 | 28 | 27 | 27 |

FIG. 6D

| Imaging area | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Main drop | ○ | × | ○ | ○ | ○ | ○ | × | ○ | ○ | × | ○ | ○ | ○ | ○ | ○ |
| Area (μm²) | 40 | 125 | 34 | 34 | 32 | 31 | 8 | 29 | 29 | 6 | 27 | 26 | 26 | 26 | 25 |
| Displacement (μm) | 5 | 8 | 6 | 127 | 3 | 9 | 6 | 8 | 7 | 10 | 3 | 11 | 4 | 2 | 8 |
| Standard value (μm²) | 42 | 37 | 35 | 34 | 32 | 31 | 31 | 30 | 29 | 29 | 28 | 28 | 28 | 27 | 27 |
| Upper bound (μm²) | 59 | 52 | 49 | 47 | 45 | 44 | 43 | 42 | 41 | 40 | 40 | 39 | 39 | 38 | 38 |
| Lower bound (μm²) | 34 | 30 | 28 | 27 | 26 | 25 | 25 | 24 | 24 | 23 | 23 | 22 | 22 | 22 | 22 |

FIG. 10A

| Imaging area | 1 | | 2 | | 3 | | 4 | | 5 | | 6 | | 7 | | 8 | |
|---|---|---|---|---|---|---|---|---|---|---|---|---|---|---|---|---|
| Deposit | 1-1 | 1-2 | 2-1 | 2-2 | 3-1 | 3-2 | 4-1 | 4-2 | 5-1 | 5-2 | 6-1 | 6-2 | 7-1 | 7-2 | 8-1 | 8-2 |
| Area ($\mu m^2$) | 40 | 36 | 125 | 36 | 34 | 125 | 34 | 32 | 32 | 31 | 31 | 32 | 8 | 30 | 29 | 29 |
| Displacement ($\mu m$) | 5 | 101 | 8 | 11 | 6 | 123 | 127 | 134 | 3 | 114 | 9 | 12 | 6 | 10 | 8 | 121 |

FIG. 10B

| Imaging area | 1 | | 2 | | 3 | | 4 | | 5 | | 6 | | 7 | | 8 | |
|---|---|---|---|---|---|---|---|---|---|---|---|---|---|---|---|---|
| Deposit | 1-1 | 1-2 | 2-1 | 2-2 | 3-1 | 3-2 | 4-1 | 4-2 | 5-1 | 5-2 | 6-1 | 6-2 | 7-1 | 7-2 | 8-1 | 8-2 |
| Area ($\mu m^2$) | 40 | 36 | 125 | 36 | 34 | 125 | 32 | 34 | 32 | 31 | 31 | 32 | 8 | 30 | 29 | 29 |
| Displacement ($\mu m$) | 5 | 101 | 8 | 11 | 6 | 123 | 127 | 134 | 3 | 114 | 9 | 12 | 6 | 10 | 8 | 121 |
| Standard value ($\mu m^2$) | 42 | | 37 | | 35 | | 34 | | 32 | | 31 | | 31 | | 30 | |
| Upper bound ($\mu m^2$) | 59 | | 52 | | 49 | | 47 | | 45 | | 44 | | 43 | | 42 | |
| Lower bound ($\mu m^2$) | 34 | | 30 | | 28 | | 27 | | 26 | | 25 | | 25 | | 24 | |

FIG. 10C

| Imaging area | 1 | | 2 | | 3 | | 4 | | 5 | | 6 | | 7 | | 8 | |
|---|---|---|---|---|---|---|---|---|---|---|---|---|---|---|---|---|
| Deposit | 1-1 | 1-2 | 2-1 | 2-2 | 3-1 | 3-2 | 4-1 | 4-2 | 5-1 | 5-2 | 6-1 | 6-2 | 7-1 | 7-2 | 8-1 | 8-2 |
| Area ($\mu m^2$) | 40 | 36 | 125 | 36 | 34 | 125 | 32 | 34 | 32 | 31 | 31 | 32 | 8 | 30 | 29 | 29 |
| Displacement ($\mu m$) | 5 | 101 | 8 | 11 | 6 | 123 | 127 | 134 | 3 | 114 | 9 | 12 | 6 | 10 | 8 | 121 |
| Standard value ($\mu m^2$) | 42 | | 37 | | 35 | | 34 | | 32 | | 31 | | 31 | | 30 | |
| Upper bound ($\mu m^2$) | 59 | | 52 | | 49 | | 47 | | 45 | | 44 | | 43 | | 42 | |
| Lower bound ($\mu m^2$) | 34 | | 30 | | 28 | | 27 | | 26 | | 25 | | | | 24 | |
| Area determination | ○ | ○ | × | ○ | ○ | × | ○ | ○ | ○ | ○ | ○ | ○ | × | ○ | ○ | ○ |
| Displacement determination | ○ | × | ○ | ○ | ○ | × | × | × | ○ | × | ○ | ○ | ○ | ○ | ○ | × |

FIG. 10D

| Imaging area | 1 | | 2 | | 3 | | 4 | | 5 | | 6 | | 7 | | 8 | |
|---|---|---|---|---|---|---|---|---|---|---|---|---|---|---|---|---|
| Deposit | 1-1 | 1-2 | 2-1 | 2-2 | 3-1 | 3-2 | 4-1 | 4-2 | 5-1 | 5-2 | 6-1 | 6-2 | 7-1 | 7-2 | 8-1 | 8-2 |
| Area ($\mu m^2$) | 40 | 36 | 125 | 36 | 34 | 125 | 32 | 34 | 32 | 31 | 31 | 32 | 8 | 30 | 29 | 29 |
| Displacement ($\mu m$) | 5 | 101 | 8 | 11 | 6 | 123 | 127 | 134 | 3 | 114 | 9 | 12 | 6 | 10 | 8 | 121 |
| Standard value ($\mu m^2$) | 42 | | 37 | | 35 | | 34 | | 32 | | 31 | | 31 | | 30 | |
| Upper bound ($\mu m^2$) | 59 | | 52 | | 49 | | 47 | | 45 | | 44 | | 43 | | 42 | |
| Lower bound ($\mu m^2$) | 34 | | 30 | | 28 | | 27 | | 26 | | 25 | | 25 | | 24 | |
| Area determination | ○ | ○ | × | ○ | ○ | × | ○ | ○ | ○ | ○ | ○ | ○ | × | ○ | ○ | ○ |
| Displacement determination | ○ | × | ○ | ○ | ○ | × | × | × | ○ | × | ○ | ○ | ○ | ○ | ○ | × |
| Determination | 2 | | 5 | | 4 | | 9 | | 2 | | 1 | | 5 | | 2 | |
| Main drop | 1-1 | | 2-2 | | 3-1 | | — | | 5-1 | | — | | 7-2 | | 8-1 | |

FIG. 11A

| First proximate deposit | Area determination | O | O | O | O | x | x | x | x | O | x | O | x |
|---|---|---|---|---|---|---|---|---|---|---|---|---|---|
| | Position determination | O | O | O | O | O | O | O | O | x | x | x | x |
| Second proximate deposit | Area determination | O | O | x | x | O | O | x | x | O | O | x | x |
| | Position determination | O | x | O | x | O | x | O | x | x | x | x | x |
| Pattern | | 1 | 2 | 3 | 4 | 5 | 6 | 7 | 8 | 9 | 10 | 11 | 12 |

O: Falls within standard   x: Falls outside standard

FIG. 11B

| Pattern | Content |
|---|---|
| 1 | Indeterminate → Pattern matching or direct observation |
| 2 | Identify first proximate deposit as main drop |
| 3 | Identify first proximate deposit as main drop |
| 4 | Identify first proximate deposit as main drop |
| 5 | Identify second proximate deposit as main drop |
| 6 | Invalid discharge (no main drop) |
| 7 | Invalid discharge (no main drop) |
| 8 | Invalid discharge (no main drop) |
| 9 | Invalid discharge (no main drop) |
| 10 | Invalid discharge (no main drop) |
| 11 | Invalid discharge (no main drop) |
| 12 | Invalid discharge (no main drop) |

FIG. 13A

| Imaging area | 1 | 3 | 5 | 7 | 9 | 11 | 13 | 15 |
|---|---|---|---|---|---|---|---|---|
| Main drop determination | ○ | ○ | ○ | ○ | ○ | ○ | ○ | ○ |
| Area ($\mu m^2$) | 40 | 34 | 32 | 30 | 29 | 27 | 26 | 25 |
| Displacement ($\mu m$) | 5 | 6 | 3 | 10 | 7 | 3 | 4 | 8 |

FIG. 13B

| Imaging area | 2 | 4 | 6 | 8 | 10 | 12 | 14 |
|---|---|---|---|---|---|---|---|
| Main drop determination | ○ | ○ | ○ | ○ | ○ | ○ | ○ |
| Area ($\mu m^2$) | 36 | 34 | 31 | 29 | 6 | 26 | 26 |
| Displacement ($\mu m$) | 11 | 127 | 9 | 8 | 10 | 11 | 2 |

FIG. 15A

| Imaging area | 1 | | | 2 | | |
|---|---|---|---|---|---|---|
| Deposit | 1-1 | 1-2 | 1-3 | 2-1 | 2-2 | 2-3 |
| Area ($\mu m^2$) | 40 | 36 | 8 | 8 | 125 | 36 |
| Displacement ($\mu m$) | 5 | 101 | 133 | 3 | 8 | 11 |

FIG. 15B

| Imaging area | 1 | | | 2 | | |
|---|---|---|---|---|---|---|
| Deposit | 1-1 | 1-2 | 1-3 | 2-1 | 2-2 | 2-3 |
| Area ($\mu m^2$) | 40 | 36 | 8 | 8 | 125 | 36 |
| Displacement ($\mu m$) | 5 | 101 | 133 | 3 | 8 | 11 |
| Standard value ($\mu m^2$) | 42 | | | 37 | | |
| Upper bound ($\mu m^2$) | 59 | | | 52 | | |
| Lower bound ($\mu m^2$) | 34 | | | 30 | | |

FIG. 15C

| Imaging area | 1 | | | 2 | | |
|---|---|---|---|---|---|---|
| Deposit | 1-1 | 1-2 | 1-3 | 2-1 | 2-2 | 2-3 |
| Area ($\mu m^2$) | 40 | 36 | 8 | 8 | 125 | 36 |
| Displacement ($\mu m$) | 5 | 101 | 133 | 3 | 8 | 11 |
| Standard value ($\mu m^2$) | 42 | | | 37 | | |
| Upper bound ($\mu m^2$) | 59 | | | 52 | | |
| Lower bound ($\mu m^2$) | 34 | | | 30 | | |
| Area determination | ○ | ○ | × | × | × | ○ |
| Displacement determination | ○ | × | × | ○ | ○ | ○ |

FIG. 15D

| Imaging area | 1 | | | 2 | | |
|---|---|---|---|---|---|---|
| Deposit | 1-1 | 1-2 | 1-3 | 2-1 | 2-2 | 2-3 |
| Area ($\mu m^2$) | 40 | 36 | 8 | 8 | 125 | 36 |
| Displacement ($\mu m$) | 5 | 101 | 133 | 3 | 8 | 11 |
| Standard value ($\mu m^2$) | 42 | | | 37 | | |
| Upper bound ($\mu m^2$) | 59 | | | 52 | | |
| Lower bound ($\mu m^2$) | 34 | | | 30 | | |
| Area determination | ○ | ○ | × | × | × | ○ |
| Displacement determination | ○ | × | × | ○ | ○ | ○ |
| Determination | 2 | | | 7 | | |
| Main drop | 1-1 | | | 2-3 | | |

FIG. 16

| Pattern | Content |
|---|---|
| 1 | Indeterminate → Pattern matching or direct observation |
| 2 | |
| 3 | Identify first proximate deposit as main drop |
| 4 | |
| 5 | Identify second proximate deposit as main drop |
| 6 | Invalid discharge |
| 7 | Area determination for third proximate deposit is a circle → Identify as main drop<br>Area determination for third proximate deposit is a cross → Invalid discharge |
| 8 | |
| 9 | |
| 10 | Invalid discharge |
| 11 | |
| 12 | |

FIG. 18A

| Imaging area | 1 | | | | 2 | | | | 3 | | | |
|---|---|---|---|---|---|---|---|---|---|---|---|---|
| Deposit | 1-L-1 | 1-L-2 | 1-R-1 | 1-R-2 | 2-L-1 | 2-L-2 | 2-R-1 | 2-R-2 | 3-L-1 | 3-L-2 | 3-R-1 | 3-R-2 |
| Area (μm²) | 40 | 36 | 125 | 36 | 34 | 125 | 34 | 32 | 32 | 31 | 31 | 32 |
| Displacement (μm) | 5 | 101 | 8 | 11 | 6 | 123 | 127 | 134 | 3 | 114 | 9 | 12 |

FIG. 18B

| Imaging area | 1 | | | | 2 | | | | 3 | | | |
|---|---|---|---|---|---|---|---|---|---|---|---|---|
| Deposit | 1-L-1 | 1-L-2 | 1-R-1 | 1-R-2 | 2-L-1 | 2-L-2 | 2-R-1 | 2-R-2 | 3-L-1 | 3-L-2 | 3-R-1 | 3-R-2 |
| Area (μm²) | 40 | 36 | 125 | 36 | 34 | 125 | 32 | 34 | 32 | 31 | 31 | 32 |
| Displacement (μm) | 5 | 101 | 8 | 11 | 6 | 123 | 127 | 134 | 3 | 114 | 9 | 12 |
| Standard value (μm²) | 42 | | 37 | | 35 | | 34 | | 32 | | 31 | |
| Upper bound (μm²) | 59 | | 52 | | 49 | | 47 | | 45 | | 44 | |
| Lower bound (μm²) | 34 | | 30 | | 28 | | 27 | | 26 | | 25 | |

FIG. 18C

| Imaging area | 1 | | | | 2 | | | | 3 | | | |
|---|---|---|---|---|---|---|---|---|---|---|---|---|
| Deposit | 1-L-1 | 1-L-2 | 1-R-1 | 1-R-2 | 2-L-1 | 2-L-2 | 2-R-1 | 2-R-2 | 3-L-1 | 3-L-2 | 3-R-1 | 3-R-2 |
| Area (μm²) | 40 | 36 | 125 | 36 | 34 | 125 | 32 | 34 | 32 | 31 | 31 | 32 |
| Displacement (μm) | 5 | 101 | 8 | 11 | 6 | 123 | 127 | 134 | 3 | 114 | 9 | 12 |
| Standard value (μm²) | 42 | | 37 | | 35 | | 34 | | 32 | | 31 | |
| Upper bound (μm²) | 59 | | 52 | | 49 | | 47 | | 45 | | 44 | |
| Lower bound (μm²) | 34 | | 30 | | 28 | | 27 | | 26 | | 25 | |
| Area determination | ◉ | ○ | × | ○ | ○ | × | ○ | ◉ | ○ | ○ | ○ | ○ |
| Displacement determination | ◉ | × | ○ | ○ | ○ | × | × | × | ○ | × | ○ | ○ |

FIG. 18D

| Imaging area | 1 | | | | 2 | | | | 3 | | | |
|---|---|---|---|---|---|---|---|---|---|---|---|---|
| Deposit | 1-L-1 | 1-L-2 | 1-R-1 | 1-R-2 | 2-L-1 | 2-L-2 | 2-R-1 | 2-R-2 | 3-L-1 | 3-L-2 | 3-R-1 | 3-R-2 |
| Area (μm²) | 40 | 36 | 125 | 36 | 34 | 125 | 32 | 34 | 32 | 31 | 31 | 32 |
| Displacement (μm) | 5 | 101 | 8 | 11 | 6 | 123 | 127 | 134 | 3 | 114 | 9 | 12 |
| Standard value (μm²) | 42 | | 37 | | 35 | | 34 | | 32 | | 31 | |
| Upper bound (μm²) | 59 | | 52 | | 49 | | 47 | | 45 | | 44 | |
| Lower bound (μm²) | 34 | | 30 | | 28 | | 27 | | 26 | | 25 | |
| Area determination | ○ | ○ | × | ○ | ○ | × | ○ | ○ | ○ | ○ | ○ | ○ |
| Displacement determination | ○ | × | ○ | ○ | ○ | × | × | × | ○ | × | ○ | ○ |
| Determination | 2 | | 5 | | 4 | | 9 | | 2 | | 1 | |
| Main drop | 1-1 | | 2-2 | | 3-1 | | — | | 5-1 | | — | | ance of ink discharged by such a solution discharge device.

METHOD FOR INSPECTING SOLUTION DISCHARGE APPARATUS AND METHOD FOR PRODUCING DEVICE

TECHNICAL FIELD

The present disclosure pertains to an inspection method for a solution discharge device and to a device manufacturing method, and particularly pertains to technology for inspecting landing accuracy of ink discharged by such a solution discharge device.

BACKGROUND

A device such as an organic light-emitting element, a TFT substrate, or the like makes use of a functional layer that serves a particular function. Examples of functional layers include an organic light-emitting layer in an organic light-emitting element, an organic semiconductor layer in a TFT substrate, and so on.

Presently, device size is increasing. Methods of forming functional layers with good efficacy include a proposed wet process in which an inkjet method is used to apply a solution (hereinafter also termed ink) that contains an organic material. Such a wet process has merits in that the positional precision obtained when forming the functional layer is not dependent on substrate size, and that there are comparatively few technical obstacles to application to larger devices. A wet process using a representative inkjet method involves, firstly, arranging a discharge target on a work table of a solution discharge device and, secondly, discharging the ink solution from a plurality of discharge outlets in an inkjet head as the inkjet head scans a surface of the discharge target. The ink is then deposited on the surface of the discharge target. Subsequently, the deposited ink dries to form the functional layer (see Patent Literature 1).

In the wet process using the inkjet method, the landing accuracy of the solution discharge device must meet a certain standard in order to form the functional layer with high positional precision. That is, the solution discharge device must function to cause a predictable volume of solution to be deposited at a predictable position. In order to check that this functionality is provided, a landing accuracy inspection process is typically performed by causing the solution discharge device to discharge prior to beginning the wet process with the ink jet method.

The landing accuracy inspection process involves discharging the solution from the discharge outlets toward an inspection area provided on an inspection substrate or on a peripheral region of a semi-finished device, imaging the inspection area, and detecting a displacement value and volume for each drop according to a respective image of the drop obtained by imaging. Specifically, for example, the inspection area on which the solution has been deposited is imaged by an imaging device such as a CCD camera, pattern matching or the like is applied to deposits with in the image obtained by imaging to distinguish a main drop, the position of the main drop as distinguished is read, and calculations are performed of the displacement value of the main drop from and of the drop volume from the deposit surface area.

CITATION LIST

Patent Literature

[Patent Literature 1]
Japanese Unexamined Patent Application Publication No. 2002-318556

SUMMARY OF INVENTION

Technical Problem

However, the solution is constantly drying after landing on the inspection area, and an effect of drying is that the deposit surface area decreases over time as the solution volume decreases. As such, accurately inspecting the landing accuracy of the solution discharge device is not easy. To improve landing accuracy, for example, an approach of beginning the imaging process once the solution has completely dried has been considered. However, in such a case, there is a need to wait for the solution to dry, thus necessitating a longer time for inspection.

The present disclosure seeks to provide an inspection method for a solution discharge device that enables the landing accuracy of the solution discharge device to be inspected with high precision within a short time.

Solution to Problem

In order to achieve this aim, an inspection method for a solution discharge device, inspecting landing accuracy of drops respectively discharged onto a discharge target from each of a plurality of discharge outlets of the solution discharge device, provides: discharging the drops from the discharge outlets causing the drops to be deposited in an inspection area on a surface of the discharge target; imaging a plurality of imaging areas into which the inspection area has been divided, each of the imaging areas being imaged at an imaging time that differs for each of the imaging areas, and acquiring an image of one or more deposits within each of the imaging areas, including a drop deposit; reading a deposit surface area for each of the deposits, based on the image; judging, in each of the imaging areas, one among deposits found to have a deposit surface area falling within a deposit surface area standard as being a main drop; and evaluating the landing accuracy according to the image showing the deposit judged as being the main drop, wherein an upper bound and a lower bound of the deposit surface area standard are set in accordance with the imaging time, bound values applied to the deposit in one of the imaging areas that is imaged at a second imaging time being smaller than the values applied to the deposit in another one of the imaging areas that is imaged at a first imaging time, the second imaging time being later than the first imaging time.

Advantageous Effects of Invention

The inspection method for the solution discharge device pertaining to one aspect of the disclosure performs landing accuracy inspection for the solution discharge device over a short time in order to distinguish main drops among deposits within a range of deposit surface area deemed appropriate according to a deposit surface area standard. Also, the upper bound and the lower bound of the deposit surface area standard are determined according to the timing of imaging, such that the values applied to deposits in an imaging area imaged at a second imaging time that is later than a first imaging time are smaller than those applied to deposits in an imaging area imaged at the first imaging time. Thus, landing accuracy inspection is performed for the solution discharge device with high precision.

BRIEF DESCRIPTION OF DRAWINGS

FIGS. 6A-6D are data tables pertaining to Embodiment 1.

FIGS. 10A-10D are data tables pertaining to Embodiment 2.

FIGS. 11A and 11B indicate judgement patterns used in the main drop determination pertaining to Embodiment 2.

FIGS. 13A and 13B are data tables pertaining to Variation 1.

FIGS. 15A-15D are data tables pertaining to Variation 2.

FIG. 16 indicates a judgement pattern used in the main drop determination pertaining to Variation 2.

FIGS. 18A-18D are data tables pertaining to Variation 3.

DESCRIPTION OF EMBODIMENTS

Figure 1:
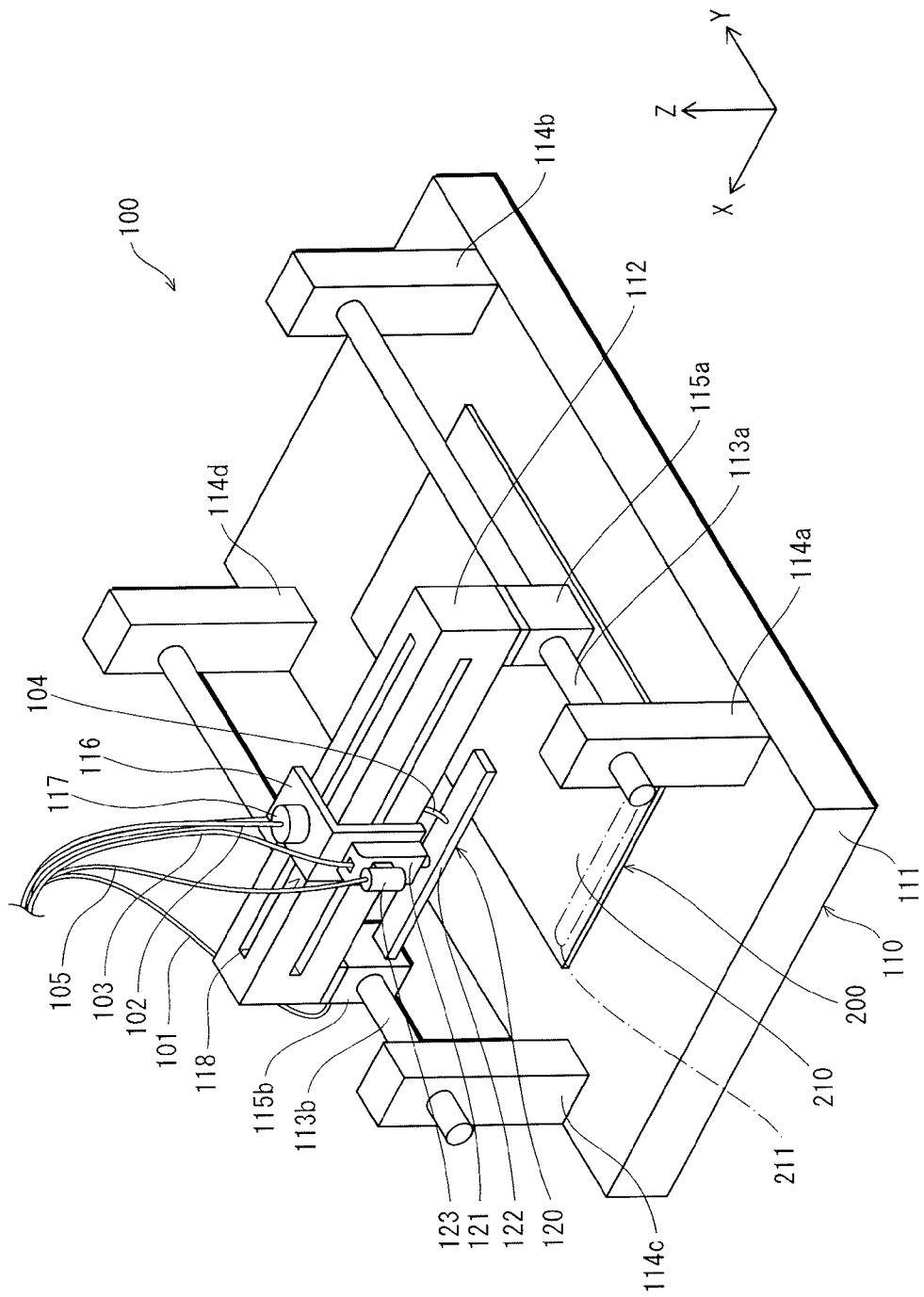
FIG. 1 shows the principal configuration of a solution discharge device pertaining to an Embodiment of the disclosure.

An inspection method and a device manufacturing method for a solution discharge device pertaining to an aspect of the disclosure are described below, with reference to the accompanying drawings.
[Overview of Aspects]

In one aspect, an inspection method for a solution discharge device, inspecting landing accuracy of drops respectively discharged onto a discharge target from each of a plurality of discharge outlets of the solution discharge device, the inspection method involving discharging the drops from the discharge outlets causing the drops to be deposited in an inspection area on a surface of the discharge target; imaging a plurality of imaging areas into which the inspection area has been divided, each of the imaging areas being imaged at an imaging time that differs for each of the imaging areas, and acquiring an image of one or more deposits within each of the imaging areas, including a drop deposit; reading a deposit surface area for each of the deposits, based on the image; judging, in each of the imaging areas, one among deposits found to have a deposit surface area falling within a deposit surface area standard as being a main drop; and evaluating the landing accuracy according to the image showing the deposit judged as being the main drop, wherein an upper bound and a lower bound of the deposit surface area standard are set in accordance with the imaging time, bound values applied to the deposit in one of the imaging areas that is imaged at a second imaging time being smaller than the values applied to the deposit in another one of the imaging areas that is imaged at a first imaging time, the second imaging time being later than the first imaging time.

In another aspect, a difference between the upper bound and the lower bound of the deposit surface area standard is set to be smaller when applied to the deposit in the one of the imaging areas that is imaged at the second imaging time relative to when applied to the deposit in the other one of the imaging areas that is imaged at the first imaging time.

In a further aspect, the judging involves selecting a subset of deposits in each of the imaging areas, creating an approximant based on the deposit surface area of each deposit in the subset of deposits, with respect to a tendency of the deposit surface area to decrease over time, and setting the upper bound and the lower bound of the deposit surface area standard in accordance with the approximant.

In an additional aspect, a respective target position is displayed on the inspection area in correspondence with each of the discharge outlets, the discharging involves discharging the drops from the discharge outlets toward the respective target position, the reading involves reading a displacement of each deposit relative to the respective target position, based on the image, and the judging involves, for each of the imaging areas, judging one among deposits found to have a deposit surface area falling within the deposit surface area standard and found to have a displacement falling within a displacement standard as being the main drop.

In yet another aspect, a respective target position is displayed on the inspection area in correspondence with each of the discharge outlets, the discharging involves discharging the drops from the discharge outlets toward the respective target position, the reading involves reading a displacement of each deposit relative to the respective target position, based on the image, and the judging involves, for each of the imaging areas, judging one among deposits found to have a deposit surface area falling within the deposit surface area standard and found to have a minimal displacement as being the main drop.

In still another aspect, the inspection area is subdivided into a plurality of neighbouring sub-divisions, each of the sub-divisions displaying a respective target position in correspondence with one of the discharge outlets, and the discharging involves discharging the drops from each of a pair of neighbouring discharge outlets toward the respective target position displayed in one of the sub-divisions.

In yet a further aspect, when a plurality of deposits within one of the imaging areas are each found to have a deposit surface area falling within the deposit surface area standard, the judging involves applying pattern matching to said deposits to judge the main drop.

In an aspect of a method, a device manufacturing method involves discharging a solution that includes a functional material from the plurality of discharge outlets of the solution discharge device onto a functional layer formation target; and forming a functional layer by drying the solution deposited on the functional layer formation target, wherein prior to forming the functional layer, the inspection method for the solution discharge device is executed, and an adjustment to the solution discharge device is applied when a landing accuracy set as a passing condition is not satisfied.

[Circumstances Leading to Invention]

As described above, the solution is constantly drying after landing in the inspection area, and drying causes the deposit surface area to grow smaller. As such, main drop determination by pattern matching is not easy to perform by precisely inspecting a landing accuracy of the solution discharge device.

For this reason, when there is a large quantity of discharge outlets in the solution discharge device, for instance, the inspection area is larger due to the larger amount of solution that is discharged. When the inspection area is large, imaging the entire area at once becomes difficult. Thus, there is a need to divide the inspection area into a plurality of smaller imaging areas such that each of these imaging areas is imaged at a different imaging time. When imaging is spread out over a plurality of instances, then differences in drying time emerge due to the timing of imaging. The later an instance of imaging, the more the deposit surface area will have shrunk due to drying by the time the solution is imaged.

In such circumstances, when a pattern matching template based on solution immediately after landing and having hardly dried is used, then solution imaged later and having had some time to dry may have an overly-reduced size and may be judged as not being a main drop despite actually being the main drop. Conversely, when a pattern matching template based on solution that has completely dried is used, then solution imaged relatively early and having had little time to dry may have an overly-large size and may likewise be judged as not being a main drop despite actually being the main drop. When erroneous judgement occurs for such reasons, precisely inspecting the landing accuracy of the solution discharge device is not easy.

Also, when there is a large quantity of discharge outlets in the solution discharge device, the increased quantity of imaging instances makes the reduction in deposit surface area due to drying more apparent and further makes precise inspection difficult. In addition, image processing by pattern matching is complicated. When pattern matching is applied, the inspection time for the solution discharge device is extended, which lowers the productivity of the device. Particularly, when there is a large quantity of discharge outlets in the solution discharge device, then there are many drops of solution subject to pattern matching. The quantity of pattern matching instances thus increases and markedly reduces the productivity of the device.

Upon searching for an inspection method that differs from pattern matching, the inventor has arrived at distinguishing the main drop according to deposit surface area of a deposit. For example, the inventor considered estimating a deposit surface area of the solution after landing based on a volume of discharged solution and setting a predetermined deposit surface area standard according to the estimation. Making the judgement that a deposit is a main drop when the deposit surface area of the deposit falls within the standard enables main drop determination to be performed without pattern matching.

However, the effect of deposit surface area reduction due to drying remains an obstacle to main drop judgement. Thus, the inventor reduced the influence of drying by setting an upper bound and a lower bound of the deposit surface area standard in accordance with the imaging time in the imaging step, such that the values applied to deposits in an imaging area imaged at a second imaging time that is later than a first imaging time are smaller than the values applied to deposits in an imaging area imaged at the first imaging time. That is, setting the upper bound and the lower bound to be relatively larger for deposits in an imaging area imaged at a first imaging time and having a short drying time, and setting the upper bound and the lower bound to be relatively smaller for deposits in an imaging area imaged at a second imaging time and having a longer drying time enables the main drop determination to be made in consideration of the reduction in deposit surface area due to drying. This enables precise solution discharge device inspection.

The inspection method for the solution discharge device pertaining to an aspect of the disclosure enables realisation of main drop determination by changing a process algorithm, and is applicable to the use of conventional equipment for solution imaging and image processing.

<Solution Discharge Device>
(Overall Configuration)

Figure 2:
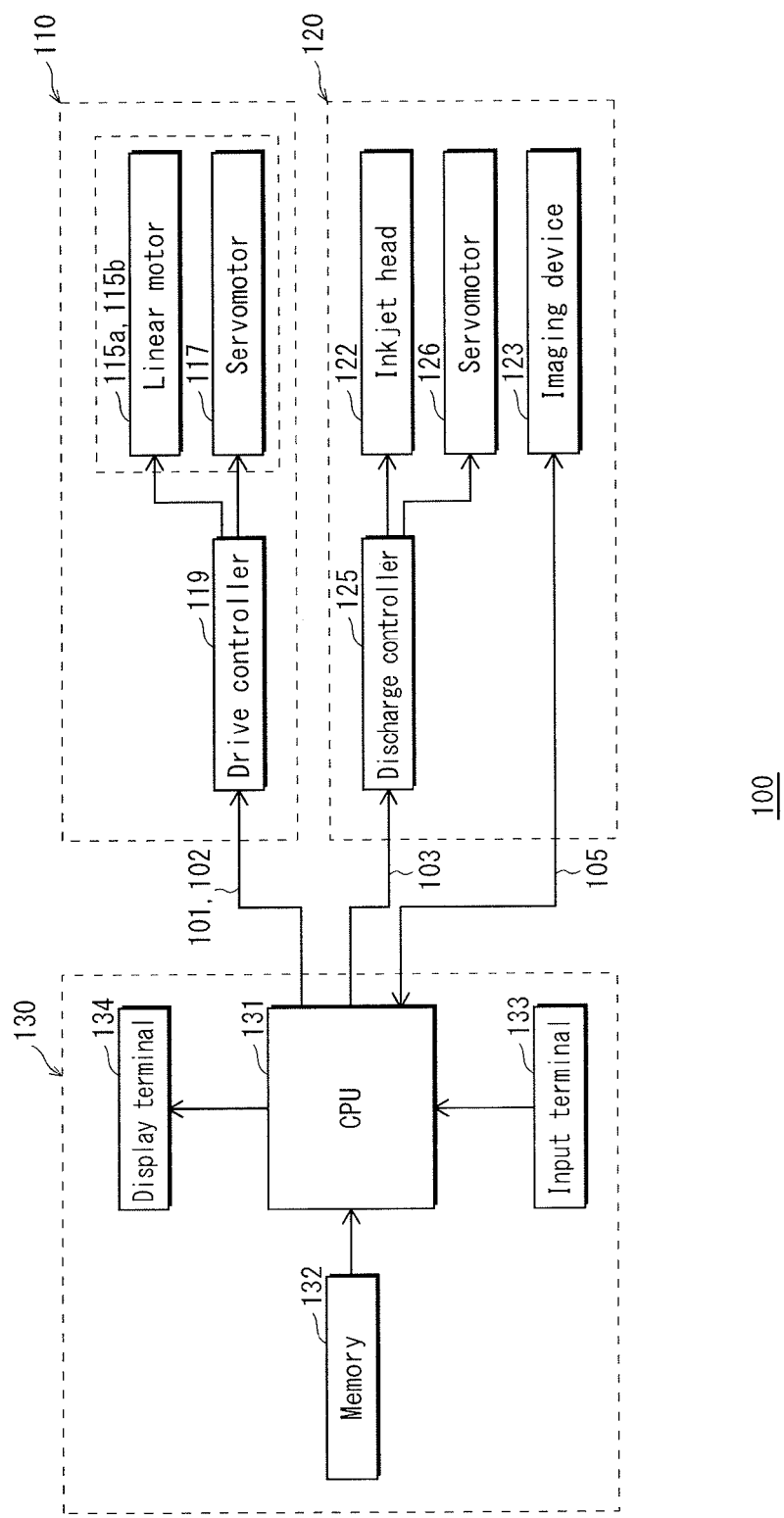
FIG. 2 is a functional block diagram of the solution discharge device pertaining to the Embodiment of the disclosure.

FIG. 1 illustrates the principal configuration of a solution discharge device pertaining to an Embodiment of the disclosure. FIG. 2 is a functional block diagram of the solution discharge device pertaining to the Embodiment of the disclosure.

As shown, the solution discharge device 100 pertaining to the aspect of the disclosure includes a work table 110, a head 120, and a control device 130.

(Work Table)

The work table 110 is a gantry table including a base 111 that is plate-like and has a discharge target 200 mounted thereon, and a moving frame 112 that is disposed over the base 111 along a longer dimension thereof.

The moving frame 112 is oriented such that a length direction thereof is aligned with the shorter direction (i.e., the X-dimension) of the base 111, and hangs across a pair of guide shafts 113a, and 113b, disposed in parallel along the longer dimension (i.e., the Y-dimension) of the base 111. The pair of guide shafts 113a and 113b, are supported by stands 114a-114d, which are columns provided at each of four corners on the surface of the base 111.

The guide shafts 113a, and 113b, are respectively provided with a linear motor 115a, and 115b. Each of two longitudinal ends of the moving frame 112 is fixed to a respective one of the linear motors 115a, and 115b. Moving the linear motors 115a, and 115b, along the guide shafts 113a, and 113b, along the Y-dimension also moves the moving frame 112 along the Y-dimension.

A mount 116 is affixed to the moving frame 112. The mount 116 is L-shaped and has a servomotor 117 mounted thereon. The servomotor 117 has a (non-diagrammed) motor axis with a tip on which a (non-diagrammed) gear is mounted. The gear meshes with a guide groove 118 on the moving frame 112. The guide groove 118 is provided along the longer dimension of the moving frame 112. A fine (non-diagrammed) rack is formed within the guide groove 118 and meshes with the gear. When the servomotor 117 is driven, the mount 116 moves along the X-dimension in a rack-and-pinion configuration.

The head 120 is mounted on the mount 116. The head 120 also moves along the X-dimension when the servomotor 117 is driven and the mount 116 moves along the X-dimension. As such, an inkjet head 122 and an imaging device 123 of the head 120 are able to scan along the X-dimension. Also, when the linear motors 115a, and 115a, are driven and cause the moving frame 112 to move along the Y-dimension, then the mount 116 is also displaced along the Y-dimension, along with the head 120. As such, the inkjet head 122 and the imaging device 123 of the head 120 are able to scan along the Y-dimension.

The servomotor 117 and the linear motors 115a, and 115b, are connected to a drive controller 119 controlling the driving thereof. The drive controller 119 is connected to a CPU 131 of the control device 130 via communication cables 101 and 102. The driving of the servomotor 117 and the linear motors 115*a*, and 115*b* is performed in accordance with a predetermined control program stored in a memory 132 of the control device, by the CPU 131 transmitting an instruction to a discharge controller 125, and the drive controller 119 driving the servomotor 117 and the linear motors 115*a*, and 115*b*, in accordance with the instruction.

(Head)

The head 120 includes a main body 121, the inkjet head 122, and the imaging device 123. The main body 121 is fixed to the mount 116 of the work table 110. The inkjet head 122 and the imaging device 123 are mounted on the main body 121.

Figure 3:
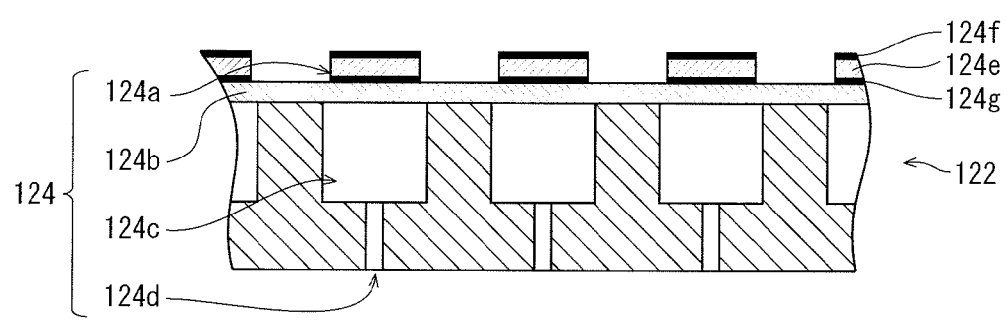
FIG. 3 is a cross-sectional diagram showing an overall configuration of an inkjet head.

FIG. 3 is a cross-sectional diagram showing an overall configuration of the inkjet head 122. As shown, the inkjet head 122 is an elongated member that includes an ink discharge mechanism 124 made up of a voltage element 124*a*, a vibration plate 124*b*, a liquid chamber 124*c*, and a discharge outlet 124*d*. The ink discharge mechanism 124 is provided in plurality (e.g., thousands). The ink discharge mechanisms 124 are disposed in a row along the length direction of the inkjet head 122 with even spacing therebetween.

The voltage element 124*a*, is, for example, a piezoelectric element, such as a laminate body in which a piezoelectric body 124*e*, which is a plate of lead zirconate titanate or the like, is sandwiched between a pair of electrodes 124*f*, and 124*g*. The voltage element 124*a*, is deformed through the application of waveform voltage thereto, at a frequency of a few hundred Hz, for example.

The vibration plate 124*b*, is a thin plate of stainless steel or of nickel, serving as the top of the liquid chamber 124*c*. The voltage element 124*a*, is stuck to a portion of a top face of the vibration plate 124*b*, corresponding to the liquid chamber 124*c*. As the voltage element 124*a*, is deformed, the portion of the voltage element 124*a*, to which the vibration plate 124*b*, is affixed also deforms and changes the volume of the liquid chamber 124*c*.

The liquid chamber 124*c*, is a space for storing ink to be discharged through the discharge outlet 124*d*. Ink is supplied to the liquid chamber 124*c*, from the exterior via an infusion tube 104 connected to the inkjet head 122. The ink supplied to the liquid chamber 124*c*, is then discharged as drops of ink, when the volume of the liquid chamber 124*c*, is reduced, from the discharge outlet 124*d*, to a discharge target 200.

The discharge outlet 124*d*, is interconnected with the liquid chamber 124*c* and disposed at a face of the inkjet head 122 opposite the base 111, i.e., at the bottom face. The discharge outlet 124*d*, is provided in plurality (i.e., thousands), and disposed along the length direction of the inkjet head 122, with separation therebetween. The arrangement of the discharge outlets 124*d*, on the inkjet head 122 is not limited to being a row. For instance, a plurality of rows may also be used. When the discharge outlets 124*d*, are provided in a plurality of rows, a zigzag arrangement enables the pitch of the discharge outlets 124*d*, to be reduced.

The main body 121 includes a drive circuit for individually driving the voltage elements 124*a*, and contains the discharge controller 125 therein. The discharge controller 125 controls a drive signal applied to the voltage elements 124*a* and causes drops of ink to be discharged from the discharge outlets 124*d*. For example, the discharge controller 125 controls a drive voltage pulse applied to the voltage element 124*a*, so as to adjust the drop volume, discharge timing, and so on for each discharge outlet 124*d*.

The discharge controller 125 is connected to the CPU 131 of the control device 130 via the communication cables 103. The CPU 131 transmits an instruction to the discharge controller 125 in accordance with a predetermined control program stored in the memory 132. The discharge controller 125 applies a predetermined drive voltage to a targeted one of the voltage elements 124*a*, in accordance with the received instruction.

The main body 121 incorporates a servomotor 126. When the servomotor 126 is driven, the inkjet head 122, which is attached to the bottom of the main body 121, rotates about the centre of a link between the main body 121 and the inkjet head 122, while a bottom face thereof remains oriented toward the base 111. Accordingly, the lengthwise angle of the inkjet head 122 changes relative to the X-dimension and the Y-dimension. Adjusting this angle enables adjustment to the pitch angle of each discharge outlet 124*d*, relative to the corresponding discharge target.

The imaging device 123 is, for example, a CCD camera, connected to the control device 130 via the communication cables 105. To inspecting the landing accuracy of the solution discharge device 100, the CPU 131 of the control device 130 transmits an imaging instruction to the imaging device 123. Upon receiving the imaging instruction, the imaging device 123 images a surface of the discharge target, which is arranged over the base 111. Then, the images imaged by the imaging device 123 are transferred to the control device 130. The CPU 131 process the transferred image in accordance with a predetermined control program stored in the memory 132.

(Control Device)

The control device 130 includes the CPU 131, the memory (including a large-capacity memory such as an HDD) 132, a display terminal 134, and an input terminal 133. The control device 130 is specifically a personal computer (hereinafter, PC).

The memory 132 stores control programs and the like for driving the head 120 and the work table 110 connected to the control device 130. When the solution discharge device 100 is being driven, the CPU 131 performs predetermined control in accordance with an instruction input thereto by an operator via the input terminal 133 and with control programs stored in the memory 132.

An inspection method for the solution discharge device pertaining to an aspect of the present disclosure, and a portion of a device manufacturing method pertaining to another aspect of the disclosure, are performed using the solution discharge device 100 configured as described above.

<Inspection Method for Solution Discharge Device>

(Embodiment 1)

Figure 4A:
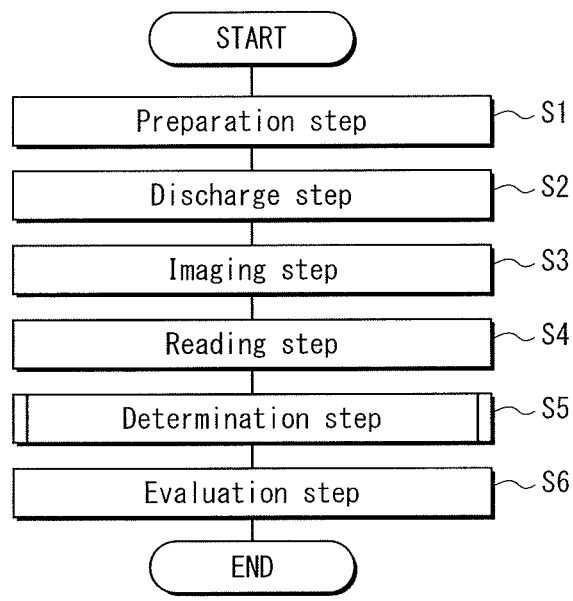
FIGS. 4A and 4B are process diagrams of an inspection method for the solution discharge device pertaining to Embodiment 1.
Figure 4B:
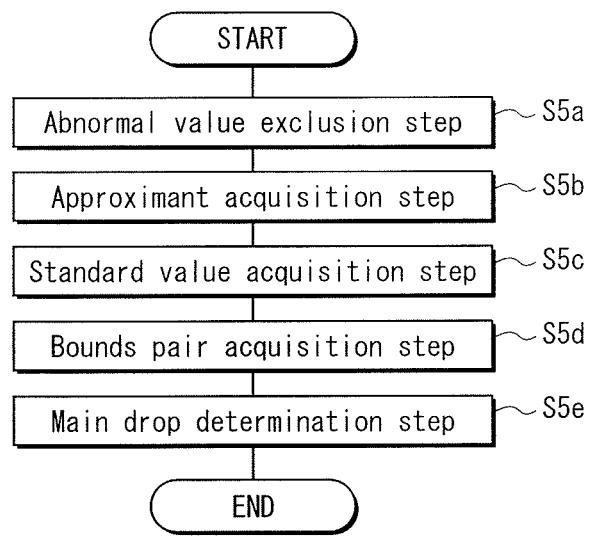
Figure 5:
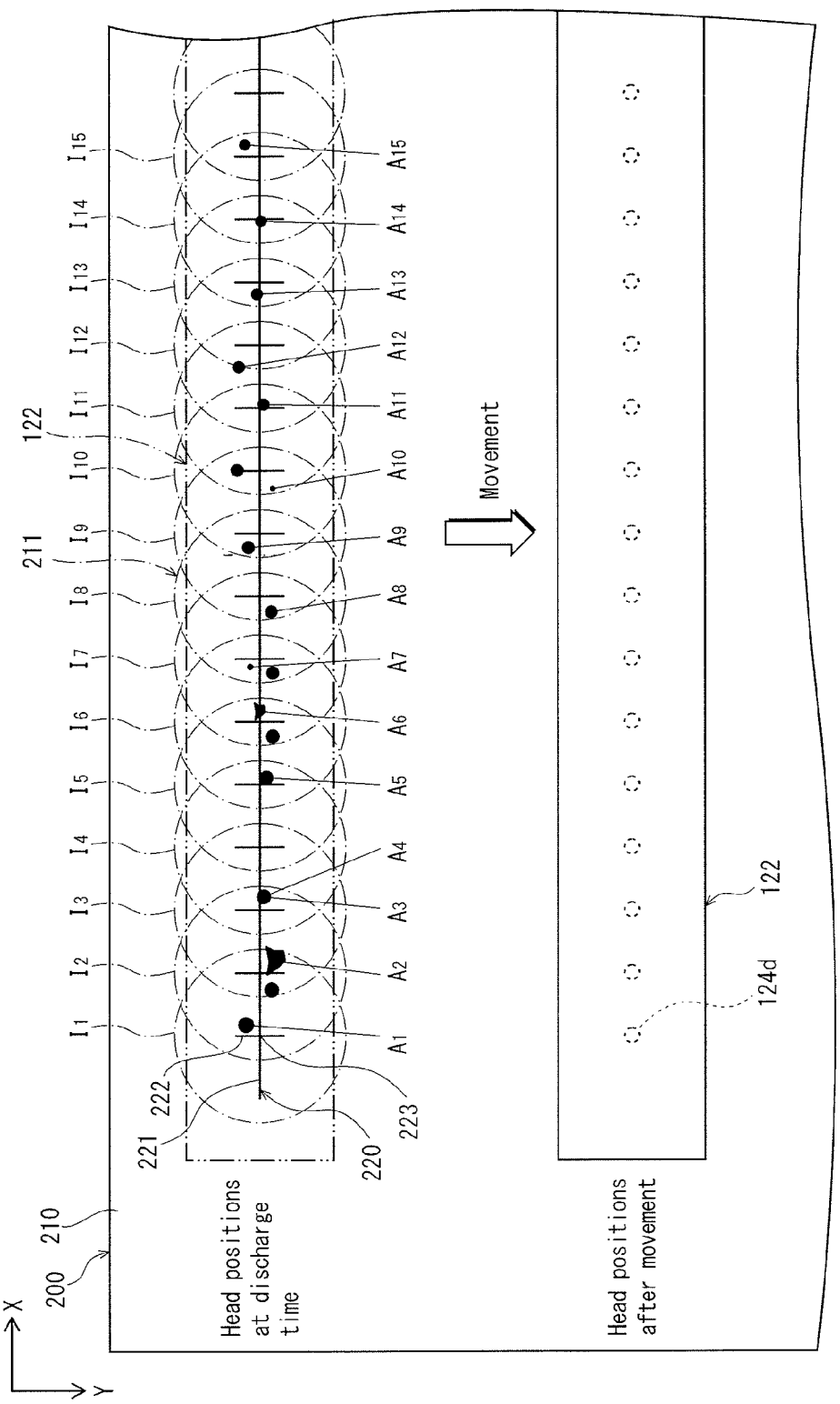
FIG. 5 shows deposits subject to main drop determination in Embodiment 1.
Figure 7A:
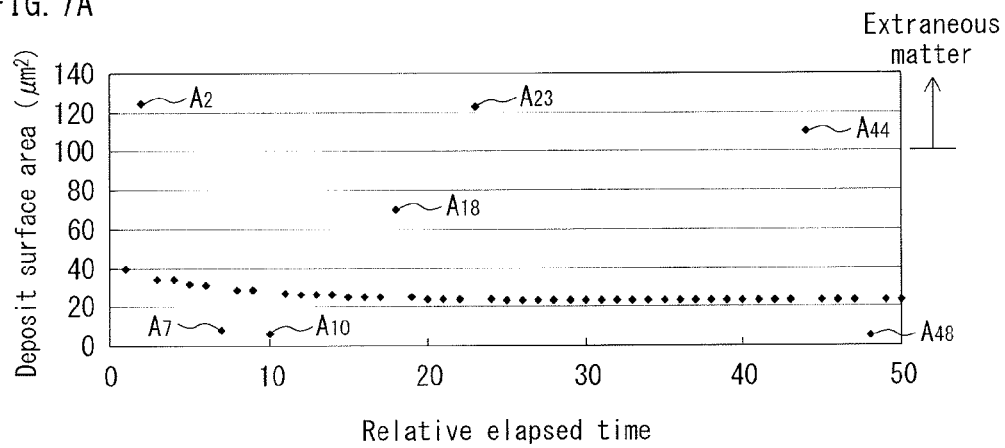
FIGS. 7A-7C are graphs illustrating a tendency of ink deposit surface area to decrease over time, pertaining to Embodiment 1.
Figure 7B:
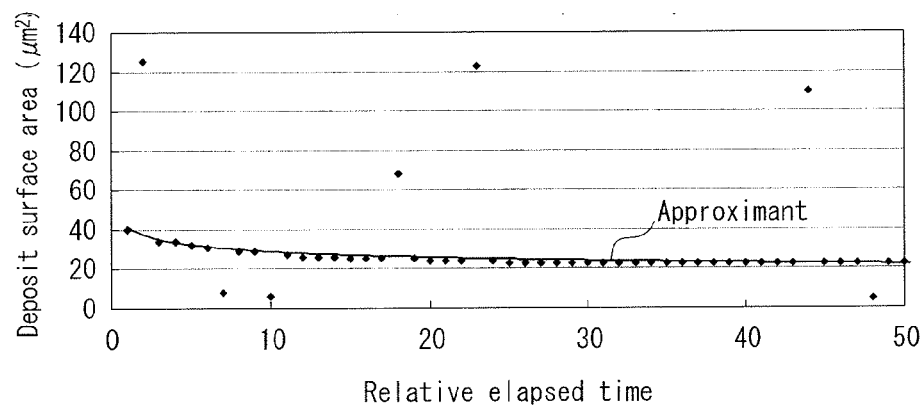
Figure 7C:
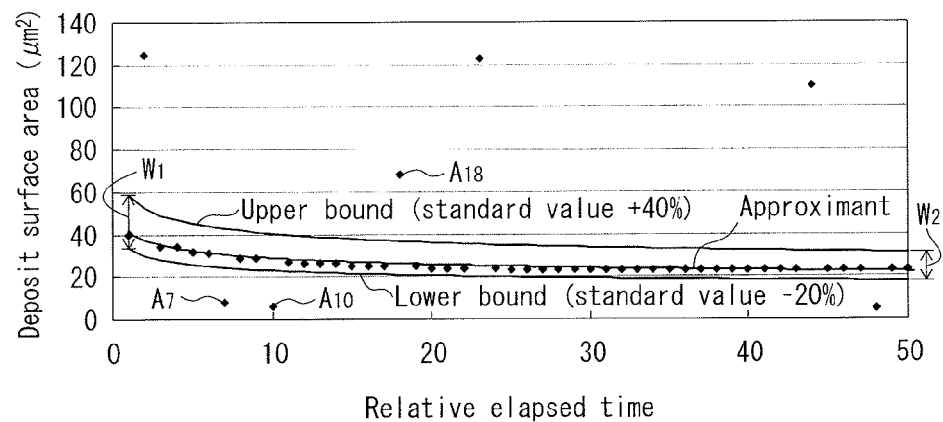

FIGS. 4A and 4B are process diagrams of the inspection method for the solution discharge device pertaining to Embodiment 1. FIG. 5 illustrates deposits subject to main drop determination in Embodiment 1. FIGS. 6A-6D are data tables pertaining to Embodiment 1. FIGS. 7A-7C are graphs illustrating the tendency of the ink deposit surface area to decrease over time, pertaining to Embodiment 1.

As shown in FIG. 4A, the inspection method for the solution discharge device pertaining to Embodiment 1 is a method of inspecting landing accuracy of the solution discharge device. The inspection method includes a preparation step (step S1), a discharge step (step S2), an imaging step (step S3), an acquisition step (step S4), a judgement step (step S5), and an evaluation step (step S6).

As shown in FIGS. 5, the preparation step (step S1) involves mounting a discharge target 200 on the base 111 of the solution discharge device 100, the discharge target 200 having a surface 210 with an inspection area 211 in which an alignment mark 220 appears. The discharge target 200 is an inspection substrate prepared for inspecting landing accuracy, a semi-finished product prior to functional layer formation, or similar. The semi-finished product is, for example, a semi-finished device prior to formation of a hole transport layer or light-emitting layer. The alignment mark 220 appears, for example, on a peripheral region (i.e., a border region) of the semi-finished product, which is a non-light-emitting region.

The alignment mark 220 is, for example, made up of a long line segment 221 extending in the X-dimension, and a plurality of short line segments 222 extending in the Y-dimension and vertically intersecting the long line segment 221. The points of intersection between the long line segment 221 and the short line segments 222 are target positions 223 for the ink discharged from the discharge outlets 124d. The target positions 223 are arranged in accordance with the discharge outlets 124d, such that the spacing between each of the discharge outlets 124d, is equal to the spacing between the target positions 223. The alignment mark 220 is not limited to the above-described configuration. Any appearance enabling the target positions 223 to be specified relative to the discharge outlets 124d, may be used.

The discharge step (step S2) involves discharging ink from the discharge outlets 124d, of the solution discharge device 100 toward the respective target position 223 corresponding to each discharge outlet 124d, such that drops of ink land in the inspection area 211. The inspection area 211 is an area on the surface 210 of the discharge target 200 subject to imaging by the imaging device 123. All of the target positions 223 in the alignment mark 220 are within the inspection area 211.

The imaging step (step S3) involves splitting the inspection area 211 into a plurality of imaging areas $I_1$, through $I_n$, (shown as imaging areas $I_1$, through $I_{15}$, in FIG. 5), sequentially imaging the imaging areas $I_1$, through $I_n$, at different times, and acquiring an image of deposits at each inspection area $I_1$, through $I_n$. The inspection area 211 includes all imaging areas $I_1$, through $I_n$.

The imaging areas $I_1$, through $I_n$, are, for example, a range subject to simultaneous imaging by the imaging device 123. In the present Embodiment, one target position 223 is located in each of the imaging areas $I_1$, through $I_n$. That is, each target position 223 is imaged once. The target positions 223 are each located at the centre of one of the imaging areas $I_1$, through $I_n$.

Also, a plurality of target positions (hereinafter, subject target positions) 223 may be subject to main drop determination within any one of the imaging areas $I_1$, through $I_n$. Having a plurality of subject target positions 223 within one of the imaging areas $I_1$, through $I_n$, enables a reduction of the number of imaging instances. In a conventional inspection method for a solution discharge device, imaging must be performed simultaneously for all target positions in order to avoid the influence of drying. That is, all target positions must be within a single imaging area and all must be imaged at once. However, in the inspection method for a solution discharge device pertaining to the present Embodiment, a plurality of subject target positions 223 may be located within one of the imaging areas $I_1$, through $I_n$. The reason is that drying has been taken into consideration when setting deposit surface area standards.

Typically, one drop of ink is discharged from each one of the discharge outlets 124d. That drop of ink is identified as the main drop, and the landing accuracy of the solution discharge device 100 is evaluated on the basis of that main drop. However, during discharge, a drop of ink other than the main drop (i.e., a satellite) may also occur in the form of a drop of ink having a smaller volume than the main drop. When such a satellite has been produced, there is a need to determine which of these drops is the main drop in order to perform the landing accuracy evaluation for the solution discharge device 100. The landing accuracy evaluation for the solution discharge device 100 is then performed on the basis of the main drop.

Aside from the drops of ink (i.e., the main drop and satellite) discharged from the discharge outlets 124d, trash, dust, and other extraneous matter may occur as deposits in the inspection area 211. In FIG. 5, only a deposit nearest the target position 223 (hereinafter, a first proximate deposit) within each of the imaging areas $I_1$, through $I_n$, is given a reference sign. However, additional deposits other than first proximate deposits $A_1$, through $A_{15}$, may also be present in the inspection area 211. Among the first proximate deposits $A_1$, through $A_{15}$, first proximate deposits $A_1$, $A_3$ ($A_4$), $A_5$, $A_8$, $A_9$, and $A_{11}$, through $A_{15}$, correspond to main drops, first proximate deposits $A_7$, and $A_{10}$, correspond to satellites, and first proximate deposits $A_2$, and $A_6$ correspond to extraneous matter. However, during the imaging step (step S3), no determination has yet been made regarding whether these first proximate deposits $A_1$ through $A_{15}$, are main drops, satellites, or extraneous matter.

The acquisition step (step S4) involves reading deposit information pertaining to the first proximate deposits based on the image of each deposit. Specifically, for each imaging area $I_1$-$I_n$, a displacement value is read for all deposits within each of the imaging areas $I_1$-$I_n$, and a deposit having the smallest displacement value is identified as the first proximate deposit $A_1$-$A_n$. Then, an elapsed time, a deposit surface area, and the displacement value are read for each deposit.

The elapsed time is time elapsed from landing to the time of imaging, or the time elapsed from discharge to the time of imaging. This time may be computed by using a timer to calculate an actual time, or may be represented as a relative elapsed time allocated at the time of imaging. Drying of the ink proceeds over the course of measurement time, and the deposit surface area shrinks as a function of elapsed time. Thus, a number or the like is assigned to each of the imaging areas $I_1$ through $I_n$. Specifically, the first imaging area $I_1$, is assigned the number 1, the second imaging area $I_2$, is assigned the number 2, and so on, with the fifteenth imaging area $I_{15}$, being assigned the number 15. When the imaging areas $I_1$, through $I_n$, are imaged with regularly-spaced timing, the number assigned to each imaging area $I_1$-$I_n$, is usable as a relative elapsed time. That is, given an imaging interval A, a number N assigned to each imaging area $I_1$-$I_n$, and an elapsed time T from the imaging of imaging area $I_1$, to the imaging of imaging area $I_n$, the relation $A \times (N-1) = T$ holds.

The deposit surface area is a contact surface area of the deposit on the surface 210 of the discharge target 200. The deposit surface area is, for example, acquired by specifying an outline of the deposit in a plan view based on image contrast, and reading the surface area within the outline.

The displacement value is the distance from the respective target position 223 to the deposit. The displacement value is, for example, acquired by determining the centre of the deposit within the outline of the deposit and reading a distance from the centre to the respective target position 223.

The data table of FIG. 6A indicates specific examples of the elapsed time, the deposit surface area, and the displacement value. The imaging area row indicates the relative elapsed time (i.e., the number of the imaging area $I_1$-$I_n$), the area row indicates the deposit surface area, and the displacement row indicates the displacement value. Further, in the present Embodiment, the first proximate deposits $A_1$-$A_n$, in the imaging areas $I_1$, through $I_n$, are provisionally identified as main drops. Thus, the main drop row shows a circle for each imaging area $I_1$-$I_n$, signifying that the first proximate deposit $A_1$-$A_n$, has been provisionally identified as a main drop.

The judgement step (step S5) involves judging whether or not the first proximate deposit $A_1$-$A_n$, is a main drop according to the deposit surface area of each first proximate deposit $A_1$-$A_n$, and involves an abnormal value exclusion step (step S5a), an approximant acquisition step (step S5b), a standard value acquisition step (step S5c), a bounds pair value acquisition step (step S5d), and a main drop judgement step (step S5e).

The abnormal value exclusion step (step S5a) involves excluding any first proximate deposit $A_1$-$A_n$, having an abnormal deposit surface area from consideration as a main drop, by determining that this first proximate deposit $A_1$-$A_n$ is not a main drop. Beneficially, a deposit having an overly large deposit surface area is excluded as being extraneous matter and a deposit having an overly small deposit surface area is excluded as being a satellite. However, either one of the overly-large and overly-small exclusions may be performed independently. In the present Embodiment, a deposit is only excluded from consideration as the main drop when overly large.

FIG. 7A is a graph in which each item of elapsed time and deposit surface area listed in FIG. 6A has been plotted in x-y coordinates, where the x-dimension represents the elapsed time from landing to imaging and the y-dimension represents the deposit surface area. Here, first proximate deposits $A_2$, $A_{23}$, and $A_{44}$, each clearly have a deposit surface area too great to be main drops, and are thus excluded from the main drop determination in order to prevent a later-described approximant creation process from being applied to these first proximate deposits. In the present Embodiment, any deposit surface area in excess of 100 μm² is excluded. As a result, the first proximate deposit $A_2$, in imaging area $I_2$, has been excluded as indicated in the data table of FIG. 6B, and the main drop determination therefor has been changed from a circle to a cross, the latter signifying that this drop has been judged as not being a main drop.

Also, in the present Embodiment, the first proximate deposit $A_{18}$, also has a large deposit surface area and is likely to be extraneous matter, but does not exceed 100 μm² and is thus not excluded, as the possibility yet remains that this is a main drop. Also, first proximate deposits $A_7$, and $A_{10}$, have a small deposit surface area and are thus likely to be satellites or extraneous matter. However, these deposits are not excluded as the possibility yet remains that these are main drops. To exclude first proximate deposits $A_7$, and $A_{10}$, any deposit surface area of 10 μm² or less may be deemed to be abnormal and excluded from consideration as a main drop.

Any reference value may be set for determination of abnormalities. However, when a deposit surface area is large enough or small enough to potentially decrease the precision of the approximant, that deposit is beneficially excluded from consideration as a main drop.

The approximant acquisition step (step S5b) involves creating an approximant that is a curve of best fit for the decrease of deposit surface area over time, as shown in FIG. 7B. This approximant is based on the graph obtained by plotting the elapsed time and the deposit surface area. As shown in FIG. 7B, in this example, the approximant fits $y=ax^b$, (where a and b are integers). The shrinking behaviour of the deposit surface area due to drying frequently produces a shrinkage curve that is similar to an exponential function. Thus, the approximant is beneficially obtained by regression. However, the approximant is not limited to being a curve of best fit, but may also be a line of best fit.

The standard value acquisition step (step S5c) involves acquiring a standard value of the deposit surface area at each imaging time, based on the approximant obtained in the approximant acquisition step (step S5b). Accordingly, a standard value is defined according to imaging time, as indicated in the data table of FIG. 6C.

The bounds pair acquisition step (step S5d) involves determining a pair of a lower bound and an upper bound for the deposit surface area standard, in accordance with the obtained standard values. Specifically, the upper bound is 140% of the standard value and the lower bound is 80% of the standard value. The ratios defining the upper and lower bounds are not limited to 140% and 80%, but may be selected freely. Accordingly, the upper and lower bounds are acquired for each imaging time, as shown in FIG. 6D. Further, the upper and lower bounds so obtained are used to obtain, in turn, curves representing the upper and lower bounds as shown in FIG. 7C. According to the above, the deposit surface area standard is defined as being equal to or less than the upper bound and equal to or more than the lower bound. The upper and lower bounds need not necessarily be obtained from the approximant as described above, but may also be fixed.

The main drop judgement step (step S5e) involves determining whether or not the deposit surface area of each first proximate deposit $A_1$-$A_n$, is within the deposit surface area standard, i.e., is equal to or more than the lower bound and equal to or less than the upper bound, and judging that any of the first proximate deposits $A_1$-$A_n$, that is outside the standard is not a main drop. In the example of FIG. 6D, first proximate deposits $A_7$, and $A_{10}$, each have a deposit surface area that is lower than the lower bound, and are thus found not to be main drops. Thus, the main drop determination for first proximate deposits $A_7$, and $A_{10}$, has been changed from a circle to a cross, signifying that these drops have been judged not to be main drops.

Here, first proximate deposit $A_2$, which had been excluded from the main drop determination in the abnormal value exclusion step (step S5a), is of course identified in the main drop judgement step (step S5e) as not being a main drop due to falling outside the deposit surface area standard. However, the main drop determination for first proximate deposit $A_2$, is already a cross and is thus not changed.

Also, any deposit having a deposit surface area that does not exceed 100 μm², such as first proximate deposit $A_{23}$, as indicated in FIG. 7A, is not excluded in the abnormal value exclusion step (step S5a). Thus, in the main drop judgement step (step S5e), this deposit is found to have a deposit surface area exceeding the upper bound of the deposit surface area standard as shown in FIG. 7C, and is thus judged not to be a main drop.

Also, a determination may be made regarding whether or not the displacement value for each first proximate deposit $A_1$-$A_n$, is within a displacement value standard, to judge that any first proximate deposit having a displacement value that does not fall within the standard is not a main drop. For instance, a tolerable upper bound of the displacement value may be set in advance as a threshold, such that any of the first proximate deposits $A_1$-$A_n$, exceeding that threshold is judged as not being a main drop. As a specific example, an upper bound of 60 µm may be set for the displacement value, such that first proximate deposit $A_4$, (having a displacement value of 127 µm), which exceeds this upper bound, is judged not to be a main drop. In such a case, the main drop determination of first proximate deposit $A_4$, is changed from a circle to a cross.

The evaluation step (step S6) involves evaluating the landing accuracy of each first proximate deposit having been judged to be a main drop (in FIG. 6D, $A_1$, $A_3$-$A_6$, $A_8$, $A_9$, and $A_{11}$-$A_{15}$) in terms of displacement value and liquid volume calculated from the deposit surface area.

According to the above, the inspection is complete for the solution discharge device. Adjustments to the solution discharge device are then applicable during functional layer formation, in accordance with evaluation results obtained thereby.

Here, in the judgement step (step S5), the bounds pair acquisition step (step S5d) involves setting the upper and lower bounds of the deposit surface area standard according to the approximant. As such, this approximant reflects the shrinkage of the deposit surface area over time due to ink drying, and there is thus a tendency for the standard value to be smaller for later imaging times. Accordingly, the upper and lower bounds obtained by applying a constant value to the standard value show a tendency to become smaller for later imaging times. For instance, in FIG. 6D, the upper bound is 59 µm$^2$ and the lower bound is 34 µm$^2$ for first proximate deposit $A_1$. However, for first proximate deposit $A_{15}$, the upper bound is 38 µm$^2$ and the lower bound is 22 µm$^2$.

If the upper and lower bounds were not set so as to grow smaller for later imaging times and, for example, the bounds pair had a fixed value, then the shrinkage of the deposit surface area over time due to drying would not be accounted for, leading to a high probability of mistaken main drop determination. For example, when the upper bound of 59 µm$^2$ and the lower bound of 34 µm$^2$ for first proximate deposit $A_1$, are used for all of the first proximate deposits $A_1$-$A_n$, then first proximate deposit $A_{15}$, having a deposit surface area of 25 µm$^2$, does not satisfy the lower bound and is judged as not being a main drop. Also, when the upper bound of 38 µm$^2$ and the lower bound of 22 µm$^2$ for first proximate deposit $A_{15}$, are used for all of the first proximate deposits $A_1$-$A_n$, then first proximate deposit $A_1$, having a deposit surface area of 40 µm$^2$, dose not satisfy the upper bound and is judged as not being a main drop.

In the present Embodiment, the bounds pair for the deposit surface area standard is set to be smaller for deposits imaged later than for deposits imaged earlier in the imaging step (step S3). As such, this sort of error is unlikely to occur.

Additionally, the judgement step (step S5) involves the bounds pair acquisition step (step S5d) in which the bounds pair of the deposit surface area standard is set in accordance with the approximant, and the approximant has a tendency to be smaller for later imaging times. Accordingly, the difference between the upper and lower bounds obtained by applying a constant value to the standard value also shows a tendency to be smaller for later imaging times. For example, in FIG. 6D, first proximate deposit $A_1$, has an upper bound of 59 µm$^2$ and a lower bound of 34 µm$^2$ and as such, the difference $W_1$, between the bounds pair in FIG. 7C is of 25 µm$^2$. In contrast, first proximate deposit $A_{15}$, has an upper bound of 38 µm$^2$ and a lower bound of 22 µm$^2$ such that the difference $W_2$, therebetween is smaller, at 16 µm$^2$. Reducing the space between the bounds pair of the deposit surface area standard in this manner for deposits imaged later relative to those imaged earlier ensures that beneficial settings are also applicable to the bounds pair of the deposit surface area standard for dried ink.

(Embodiment 2)

Figure 8A:
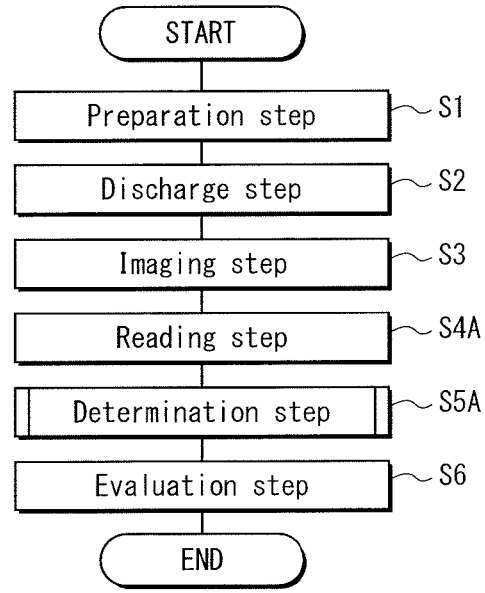
FIGS. 8A and 8B are process diagrams of an inspection method for the solution discharge device pertaining to Embodiment 2.
Figure 8B:
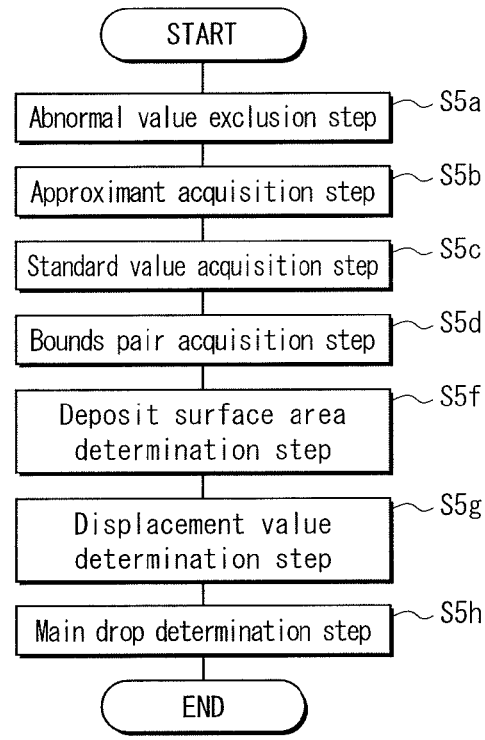
Figure 9:
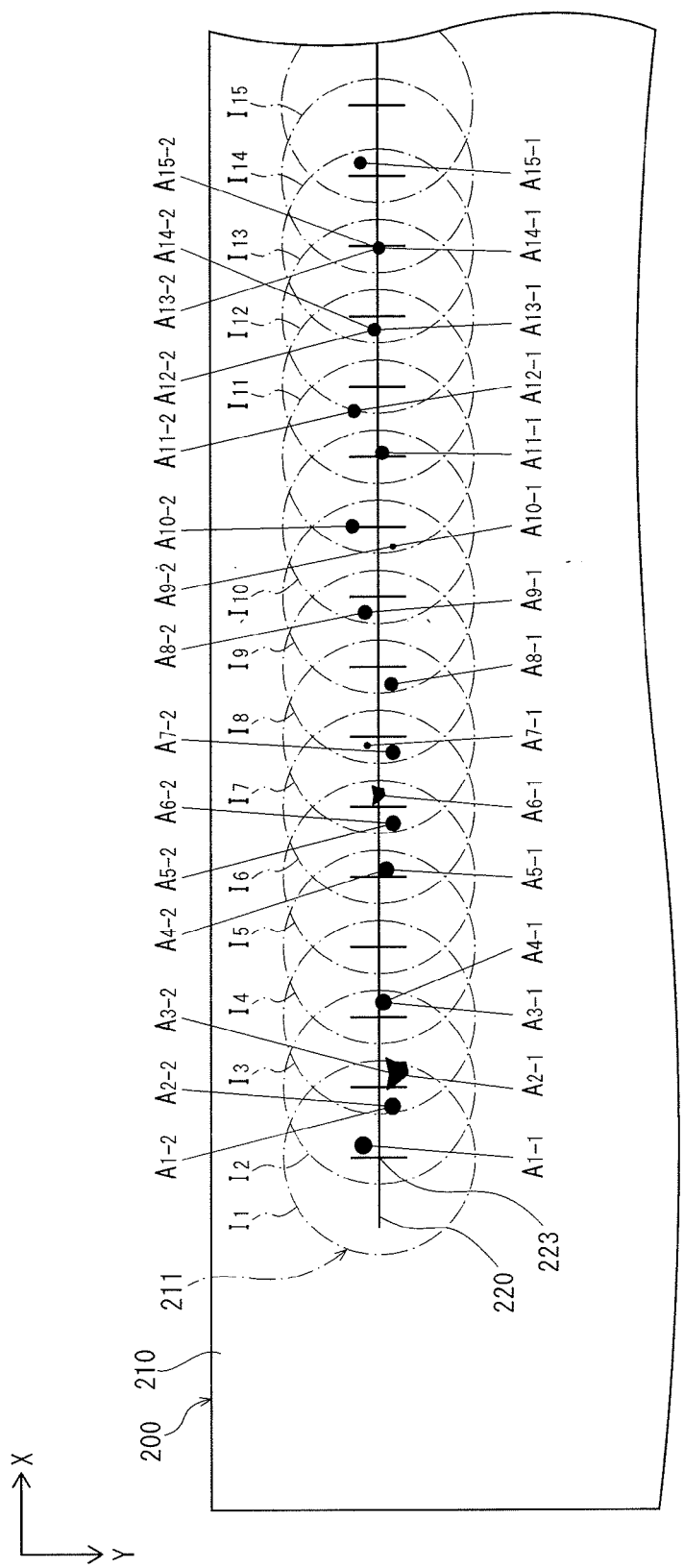
FIG. 9 shows deposits subject to main drop determination in Embodiment 2.

FIGS. 8A and 4B are process diagrams of the inspection method for the solution discharge device pertaining to Embodiment 2. FIG. 9 illustrates deposits subject to main drop determination in Embodiment 2. FIGS. 10A-10D are data tables pertaining to Embodiment 2. FIGS. 11A and 11B indicate judgement patterns used in the main drop determination pertaining to Embodiment 2.

As shown in FIG. 8A, the inspection method for the solution discharge device pertaining to Embodiment 2, is a method of inspecting landing accuracy of the solution discharge device. The method includes a preparation step (step S1), a discharge step (step S2), an imaging step (step S3), an acquisition step (step S4A), a judgement step (step S5A), and an evaluation step (step S6).

The preparation step (step Si), the discharge step (step S2), the imaging step (step S3), and the evaluation step (step S6) are substantially similar to the corresponding steps in the inspection method for the solution discharge device pertaining to Embodiment 1. The explanations thereof are thus omitted.

In the acquisition step (step S4A), deposit information is read from each imaged deposit, concerning the first proximate deposit $A_{1-1}$-$A_{n-1}$, in each of the imaging areas $I_1$, through $I_n$, and second-nearest deposits to each target position 223 (hereinafter, second proximate deposits $A_{1-2}$-$A_{n-2}$). The present Embodiment differs from the inspection method for the solution discharge device pertaining to Embodiment 1, in that the deposit information for the second proximate deposits $A_{1-2}$-$A_{n-2}$, is also read.

Specifically, for each imaging area $I_1$-$I_n$, a displacement value is read for all deposits within each of the imaging areas $I_1$-$I_n$, a deposit having the smallest displacement value is identified as the first proximate deposit $A_{1-1}$-$A_{n-1}$, and a deposit having the second-smallest displacement value is identified as the second proximate deposit $A_{1-2}$-$A_{n-2}$. As shown in the data table of FIG. 10A, the elapsed time, the deposit surface area, and the displacement value for the first proximate deposits $A_{1-1}$-$A_{n-1}$, and the second proximate deposits $A_{1-2}$-$A_{n-2}$.

In the inspection method for the solution discharge device pertaining to Embodiment 1, the first proximate deposits $A_1$-$A_n$, are provisionally judged to be main drops immediately after reading the deposit information. However, in the inspection method for the solution discharge device pertaining to Embodiment 2, no such provisional judgement is made and the main drop judgement row is not provided.

The judgement step (step S5A) involves judging whether or not the first proximate deposits $A_1$-$A_n$, and the second proximate deposits $A_{1-2}$-$A_{n-2}$, are main drops according to the deposit surface area and the displacement value of each first proximate deposit $A_1$-$A_n$, and second proximate deposit $A_{1-2}$-$A_{n-2}$, and involves an abnormal value exclusion step (step S5a), an approximant acquisition step (step S5b), a standard value acquisition step (step S5c), a bounds pair value acquisition step (step S5d), a deposit surface area determination step (step S5f), a displacement value determination step (step S5g), and a main drop judgement step (step S5h).

The abnormal value exclusion step (step S5a), the approximant acquisition step (step S5b), the standard value acquisition step (step S5c), and the bounds pair acquisition step (step S5d) are substantially similar to the corresponding steps in the inspection method for the solution discharge device pertaining to Embodiment 1. Explanations thereof are thus omitted.

The judgement step (step S5A) involves performing the abnormal value exclusion step (step S5a), the approximant acquisition step (step S5b), the standard value acquisition step (step S5c), and the bounds pair acquisition step (step S5d) are performed for the first proximate deposit $A_{1\text{-}1}\text{-}A_{n\text{-}1}$, and the second proximate deposit $A_{1\text{-}2}\text{-}A_{n\text{-}2}$, thus obtaining the standard value, the upper bound, and the lower bound therefor as indicated in FIG. 10B.

Next, the deposit surface area determination step (step S5f) involves making a determination regarding whether or not a deposit surface area of each of the first proximate deposits $A_{1\text{-}1}\text{-}A_{n\text{-}1}$ and the second proximate deposits $A_{1\text{-}2}\text{-}A_{n\text{-}2}$, falls within the deposit surface area standard. In the affirmative case, then the area judgement row of FIG. 10C is updated with a circle signifying that the surface area falls within the standard, and in the negative case, the area judgement row is updated with a cross signifying that the surface area falls outside the standard.

Also, the displacement value determination step (step S5g) involves making a determination regarding whether or not the displacement value for each of the first proximate deposits $A_{1\text{-}1}\text{-}A_{n\text{-}1}$, and the second proximate deposits $A_{1\text{-}2}\text{-}A_{n\text{-}2}$, falls within the displacement value standard. The displacement value standard may be, for example, set in advance as a threshold upper bound of tolerable displacement values. In the present Embodiment, the upper bound of the displacement value is set at 60 μm, such that a displacement value of no more than 60 μm falls within the displacement value standard and a value exceeding 60 μm does not.

Then, in the affirmative case, then the area judgement row of FIG. 10C is updated with a circle signifying that the displacement value falls within the standard, and in the negative case, the area judgement row is updated with a cross signifying that the displacement value falls outside the standard.

Next, in the main drop judgement step (step S5h), a main drop determination is made in accordance with the determination tables of FIGS. 11A and 11B. First, as per the determination table of FIG. 11A, results of the surface area determination and positional determinations are used to determine whether any pattern applies, and the results are stored in the determination row of FIG. 10D. Then, main drop determination is performed by referencing the determination table of FIG. 11B for the applicable pattern, and the results are stored in the determination row of FIG. 10D.

For instance, a determination result of 2 is obtained for imaging area $I_1$ when first proximate deposit $A_{1\text{-}1}$, has a circle for the area determination as well as for the position determination and second proximate deposit $A_{1\text{-}2}$, has a circle for the area determination and a cross for the position determination. With the determination result of 2, first proximate deposit $A_{1\text{-}1}$, is judged as being a main drop.

Likewise, a determination result of 5 is obtained for imaging area $I_2$, when first proximate deposit $A_{2\text{-}1}$, has a cross for the area determination and a circle for the position determination, and second proximate deposit $A_{2\text{-}2}$, has a circle for the area determination as well as for the position determination. With the determination result of 5, first proximate deposit $A_{2\text{-}2}$, is judged as being a main drop.

Also, a determination result of 9 is obtained for imaging area $I_4$, when first proximate deposit $A_{4\text{-}1}$, has a circle for the area determination and a cross for the position determination, and second proximate deposit $A_{4\text{-}2}$, has a circle for the area determination and a cross for the position determination. With the determination result of 9, a determination is made that no main drop is present and that the discharge is invalid.

Similarly, a determination result of 1 is obtained for imaging area $I_6$, when first proximate deposit $A_{6\text{-}1}$, has a circle for the area determination as well as for the position determination, and second proximate deposit $A_{6\text{-}2}$, has a circle for the area determination as well as for the position determination. With the determination result of 1, the determination is deemed indeterminate. In such circumstances, when there are two deposits that appear to be main drops such as in imaging area $I_6$, there is a possibility that extraneous matter is present at approximately the same size as a main drop. When pattern matching is not used, it is difficult to distinguish drops and extraneous matter having similar deposit surface areas as the respective contours are not known. In the inspection method for the solution discharge device pertaining to the present Embodiment, the main drop cannot be distinguished in these circumstances. Thus, pattern matching is used to determine the main drop according to deposit shape or the like, or the main drop is identified visually.

In the present Embodiment, deposit information is obtained for the first proximate deposits $A_{1\text{-}1}\text{-}A_{n\text{-}1}$, and for the second proximate deposits $A_{1\text{-}2}\text{-}A_{n\text{-}2}$. Thus, when there is no main drop among the first proximate deposits $A_{1\text{-}1}\text{-}A_{n\text{-}1}$, the second proximate deposits $A_{1\text{-}2}\text{-}A_{n\text{-}2}$, may be examined, enabling higher precision of landing accuracy inspection.

Accordingly, accurate main drop determination is achievable for situations where the inspection method for the solution discharge device pertaining to Embodiment 1 is not applicable, such as for imaging area $I_2$, in which extraneous matter being closer to the target position 223 than the actual main drop, for imaging area $I_7$, in which main drop determination is not possible due to the satellite being closer to the target position 223 than the actual main drop, and imaging area $I_4$, in which an invalid discharge causes a drop to be identified as the main drop despite no ink discharge having occurred.

Furthermore, in the inspection method for the solution discharge device pertaining to Embodiment 1, extraneous matter in imaging area $I_6$, is judged as being a main drop. However, using the inspection method for the solution discharge device pertaining to Embodiment 2, the determination for imaging area $I_6$, is indeterminate, which leaves grounds for later main drop determination performed visually or by pattern matching.

Also, much like in Embodiment 1, the present Embodiment may also have a plurality of subject target positions 223 occur within one of the imaging areas $I_1$ through $I_n$. The above-described effects are nevertheless obtainable. Variation 3 describes details of a situation in which a plurality of subject target positions 223 are found in one of the imaging areas $I_1$, through $I_n$.

(Variation 1)

The inspection method for the solution discharge device pertaining to aspects of the disclosure has been specifically described above. However, the above-described inspection method is not intended as a limiting Embodiment and is given only as an example for easily describing the configuration, operation, and effects of the disclosure.

Figure 12:
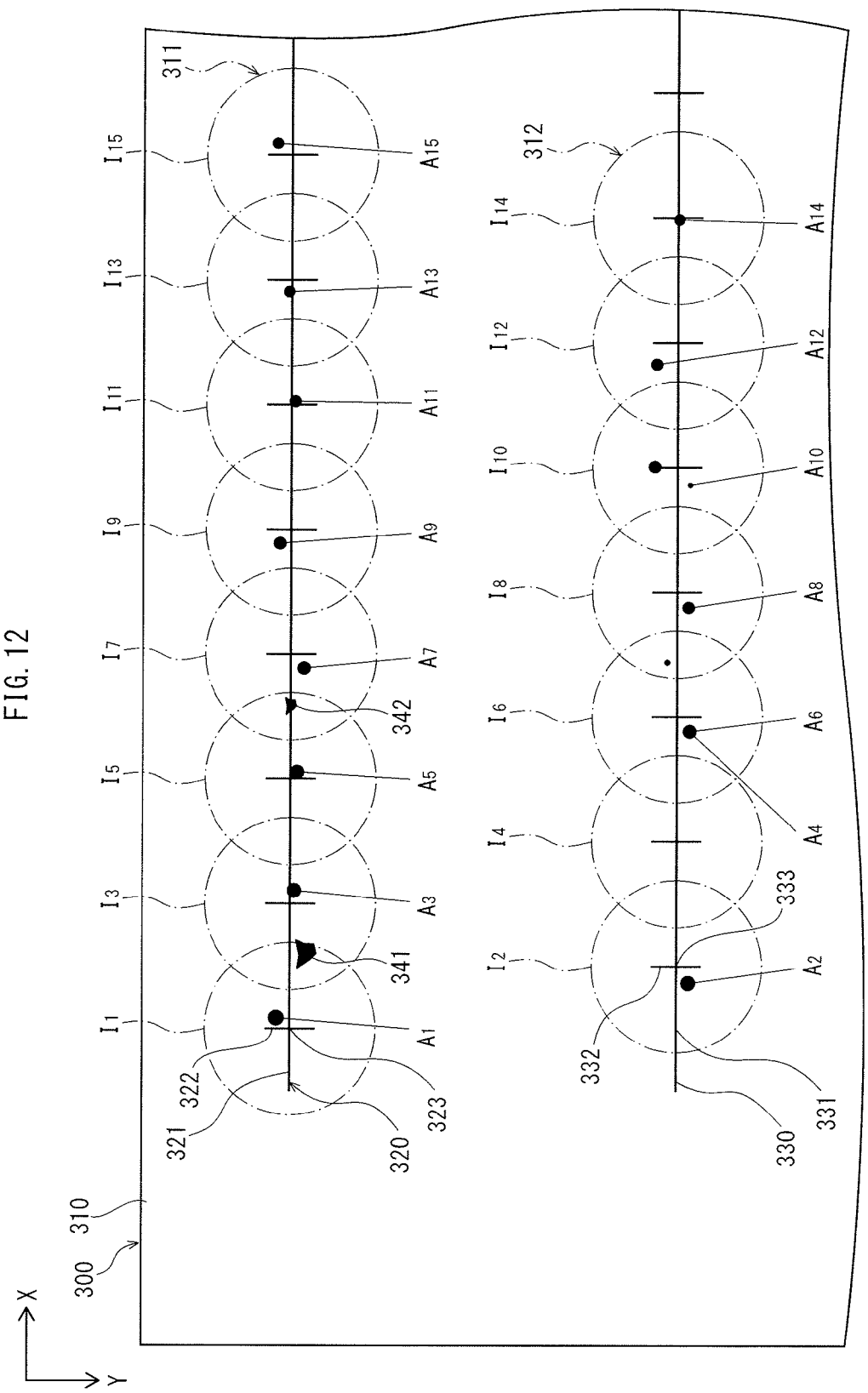
FIG. 12 shows an inspection area pertaining to Variation 1.

FIG. 12 shows an inspection area pertaining to Variation 1. FIGS. 13A and 13B are data tables pertaining to Variation 1. For example, the inspection area pertaining to Variation 1 and illustrated by FIG. 12 provides inspection areas 311 and 312 on the surface 310 of the discharge target 300 so as to have mutual separation, and displays alignment marks 320 and 330 on the inspection areas 311 and 312 so divided. The alignment marks 320 and 330 are each made up of a line segment 321 and 331 extending in the X-dimension and a plurality of line segments 322 and 332 extending in the Y-dimension, such that target positions 323 and 333 are formed at the intersection of the line segments 321, 331, 322, and 332.

The target positions 323 and 333 are provided in one-to-one correspondence with the discharge outlets 124$d$, of the inkjet head 122. Neighbouring discharge outlets 124$d$, respectively discharge ink toward different target positions 323 and 333 displayed on the inspection areas 311 and 312. For example, ink is discharged from one of the discharge outlets 124$d$, in the inkjet head 122 toward a first one of the inspection areas 311, and ink is discharged from another one of the discharge outlets 124$d$, which did not discharge ink toward the first of the inspection areas 311 toward another one of the inspection areas 312.

As such, ink is discharged in alteration over two instances, reducing the probability that ink discharged by a given one of the discharge outlets 124$d$, greatly misses a target position 323 or 333 being aimed for and the neighbouring one of the discharge outlets 124$d$, also greatly misses but has ink mistakenly land on the previous target, leading to erroneous main drop determination.

For example, in imaging area $I_8$, of FIG. 12, a main drop has landed near target position 333, and a satellite has greatly missed the intended target to land closer to the target position 333 in neighbouring imaging area $I_6$. In such a case, when ink is discharged toward one of the inspection areas 211 shown in FIG. 5, then having the aforementioned satellite land near the target position 223 of imaging area $I_7$, in FIG. 5 poses a risk that, as shown in FIGS. 6A-6C, the satellite may be judged to be the main drop in imaging area $I_7$. However, when the inspection areas 311 and 321 are separated in two as shown in FIG. 12, then the risk of erroneous judgement is reduced as the satellite is not identified as the main drop in imaging area $I_7$, resulting in more precise landing accuracy inspection. Furthermore, two main drops discharged by neighbouring discharge outlets 124$d$, land in different positions when the pitch of the discharge outlets 124$d$, in the inkjet head 122 is narrow, thus enabling more precision in main drop landing accuracy inspection.

Also, in the example of FIG. 5, extraneous matter is present near the target position 223 within imaging area $I_2$. Thus, as shown in FIG. 6A, there is a possibility that the extraneous matter may be mistakenly judged to be a main drop. However, in the example of FIG. 12, the extraneous matter is not an impediment to the judgement of the main drop in imaging area $I_2$, such that, as shown in FIG. 13B, the main drop judgement in imaging area $I_2$, is accurate. This enables more precise landing accuracy inspection.

(Variation 2)

Figure 14:
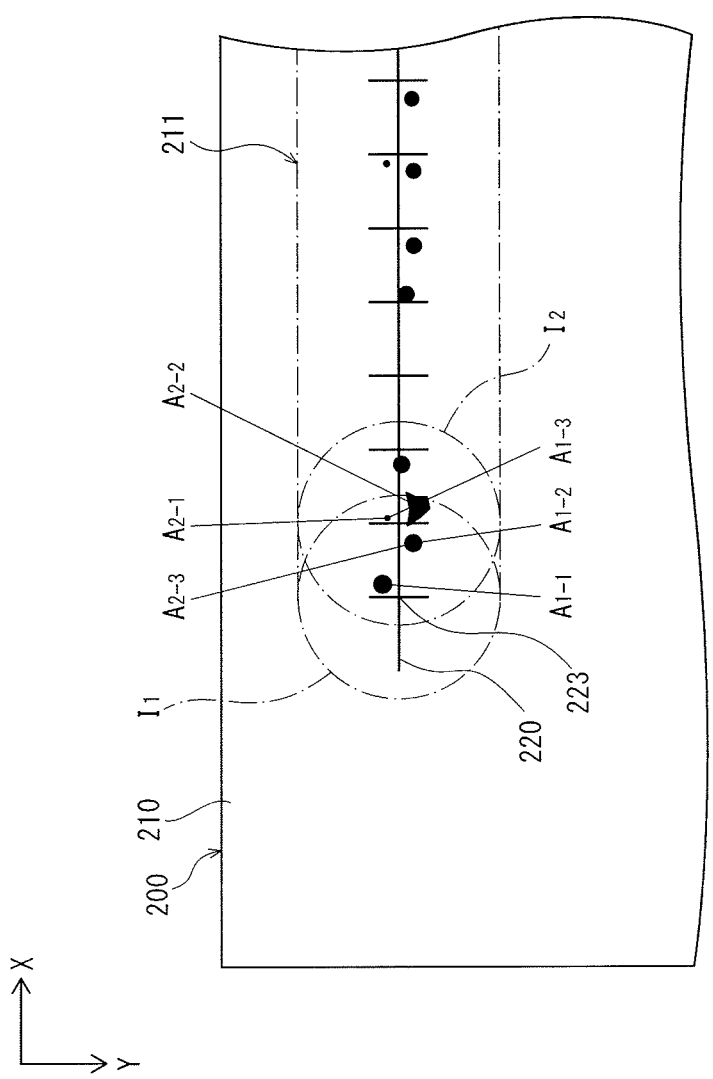
FIG. 14 shows deposits subject to main drop determination in Variation 2.

FIG. 14 shows deposits subject to main drop determination in Variation 2. FIGS. 15A-15D are data tables pertaining to Variation 2. FIG. 16 indicates a judgement pattern used in the main drop determination pertaining to Variation 2.

In the example of FIG. 14, the acquisition step involves acquiring deposit information for three proximate deposits in a single imaging area, and the judgement step involves determining the main drop according to the deposit information acquired for the three proximate deposits in each imaging area.

Specifically, in the acquisition step, deposit information is acquired as indicated in FIG. 15A, then in the judgement step, the standard value, the upper bound, and the lower bound are each acquired as indicated in FIG. 15B, and an area determination and position determination are then applied to each of the three proximal deposits as indicated in FIG. 15C. Then, a determination is made according to the judgement table shown in FIG. 11A, regarding whether or not first and second proximate deposits fit any pattern of area and position results. The resulting pattern is then cross-referenced with a judgement table of FIG. 11B to identify the main drop.

The point of difference from Embodiment 2 is in the main drop determination made when the matching pattern is 7. For instance, when first proximate deposit $A_{2-1}$, is a satellite and second proximate deposit $A_{2-2}$, is extraneous matter as is the case for imaging area $I_2$, of FIG. 14, Embodiment 2 returns an invalid discharge result a neither deposit is a main drop. However, in Variation 2, third proximate deposit $A_{2-3}$, undergoes an area determination resulting in a circle or a cross as shown in FIG. 16. When the area determination results is a circle, third proximate deposit $A_{2-3}$, is judged as being the main drop, and when it is a cross, the third proximate deposit $A_{2-3}$, is judged as not being the main drop. That is, the third proximate deposit is also evaluated such that, when the first and second proximate deposits are not the main drop, there is still a possibility that the third proximate deposit is found to be the main drop.

Also, the results of position determination for the third proximate deposit $A_{2-3}$, may be added to the basis for main drop determination such that the third proximate deposit $A_{2-3}$, is judged as being the main drop only when the area determination therefor is a circle and the position determination therefor is also a circle. In other cases, the third proximate deposit may also be judged not to be the main drop.

(Variation 3)

Figure 17:
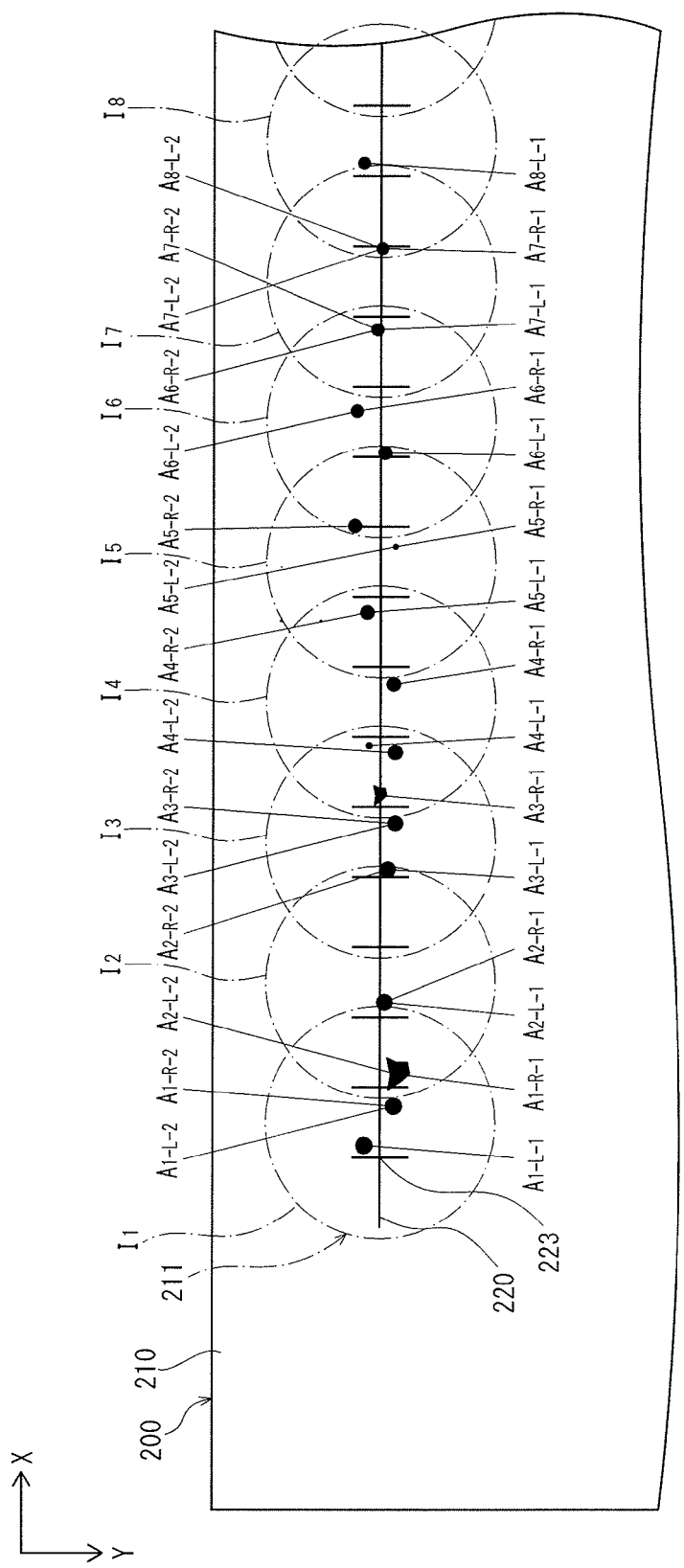
FIG. 17 shows deposits subject to main drop determination in Variation 3.

Next, a situation is described in which a plurality of subject target positions 223 are found in one of the imaging areas $I_1$, through $I_n$. FIG. 17 shows deposits subject to main drop determination in Variation 3. FIGS. 18A-18D are data tables pertaining to Variation 3. Variation 3 is similar to Embodiment 2, with a point of difference that a plurality of subject target positions are present within one of the imaging areas $I_1$, through $I_n$, while Embodiment 2 has only one subject target position per imaging area.

The imaging step of Variation 3 involves imaging the imaging area $I_1$ through $I_n$, such that two subject target positions are present therein. For example, imaging area $I_1$, of FIG. 17 includes the target positions corresponding to imaging areas $I_1$, and $I_2$, from FIG. 9, while imaging area $I_2$, of FIG. 17 includes the target positions corresponding to imaging areas $I_3$, and $I_4$, from FIG. 9.

The centre of each imaging area $I_1$, through $I_n$, in FIG. 17 is the midpoint between two subject target positions 223. For instance, the centre of imaging area $I_1$, in FIG. 7 coincides with the midpoint between the respective centres of imaging areas $I_1$, and $I_2$, in FIG. 9.

The acquisition step of Variation 3 involves reading deposit information pertaining to the first proximate deposits $A_{1-L-1}$-$A_{n-L-1}$, and the second proximate deposit $A_{1-L-2}$-$A_{n-L-2}$, of a left-hand target position 223 as well as for the first proximate deposit $A_{1-R-1}$-$A_{n-R-1}$, and the second proximate deposit $A_{1-R-2}$-$A_{n-R-2}$, of a right-hand target position 223. The data table of FIG. 18A indicates specific examples of deposit information so acquired.

In the judgement step, for each subject target position 223, a determination is made regarding whether or not any of the first proximate deposits $A_{1-L-1}$-$A_{n-L-1}$, and $A_{1-R-1}$-$A_{n-R-1}$, and the second proximate deposits $A_{1-L-2}$-$A_{n-L-2}$, and $A_{1-R-2}$-

$A_{n-R-2}$, are a main drop, in accordance with the deposit surface area and the displacement value for each deposit. The judgement is substantially identical to that of Embodiment 2, and explanations thereof are thus omitted. The standard value and the bounds pair are acquired as indicated in FIG. 18B, a determination is made regarding whether or not the deposit surface area falls within the deposit surface area standard as indicated in FIG. 18C, and a main drop judgement is made according to results of an area determination a position determination as indicated in FIG. 18D.

As discussed above, having a plurality of subject target positions 223 within one of the imaging areas $I_1$, through $I_n$, enables a reduction of the number of imaging instances. In the above-described example, two subject target positions 223 are found within one of the imaging areas $I_1$, through $I_n$. However, three or more subject target positions may also be used. Having two subject target positions 223 in one of the imaging areas $I_1$, through $I_n$, halves the quantity of images taken in comparison to the one-to-one case.

(Device Manufacturing Method)

Figure 19:
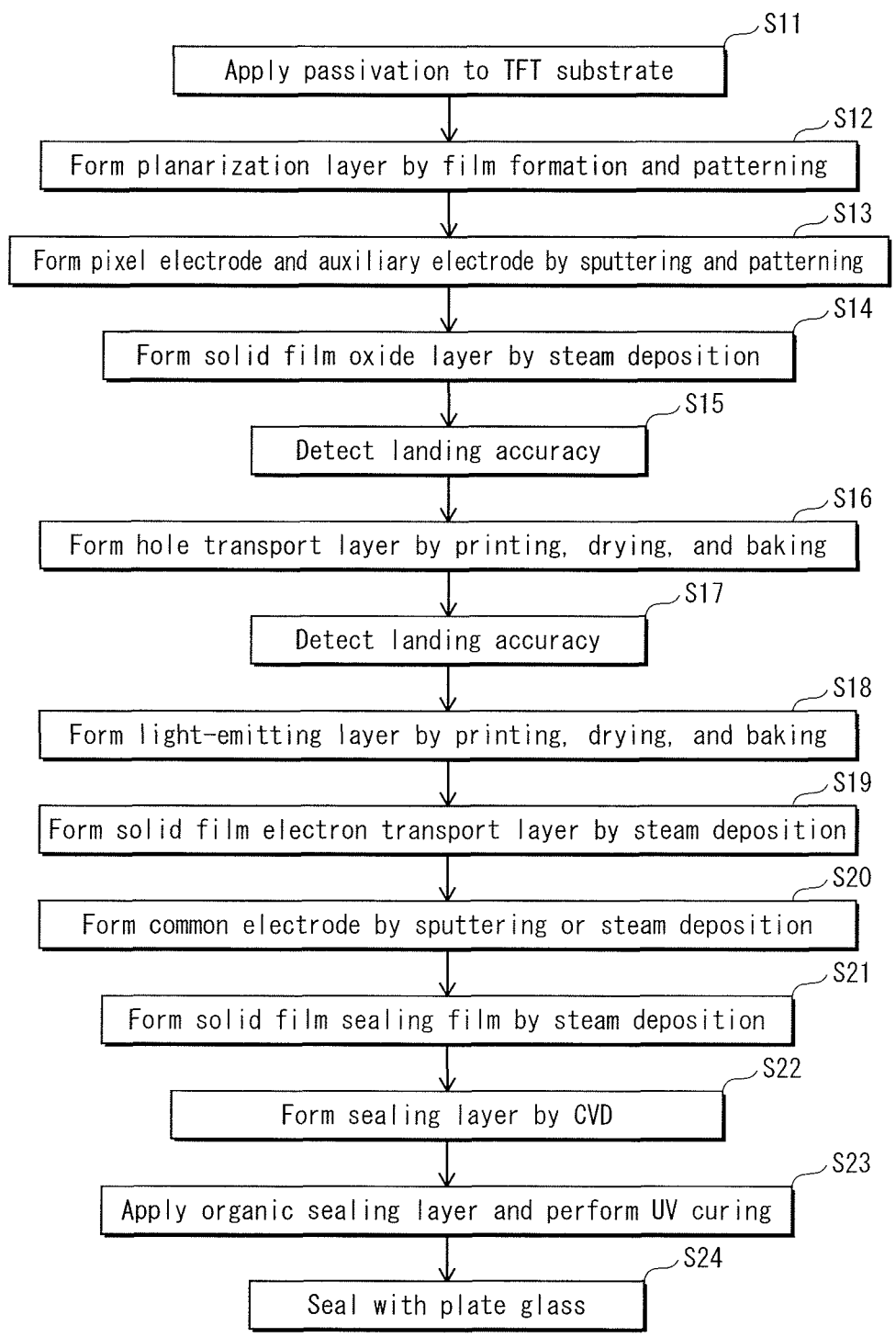
FIG. 19 is a process diagram of a manufacturing method for a device pertaining to an aspect of the disclosure.
Figure 20:
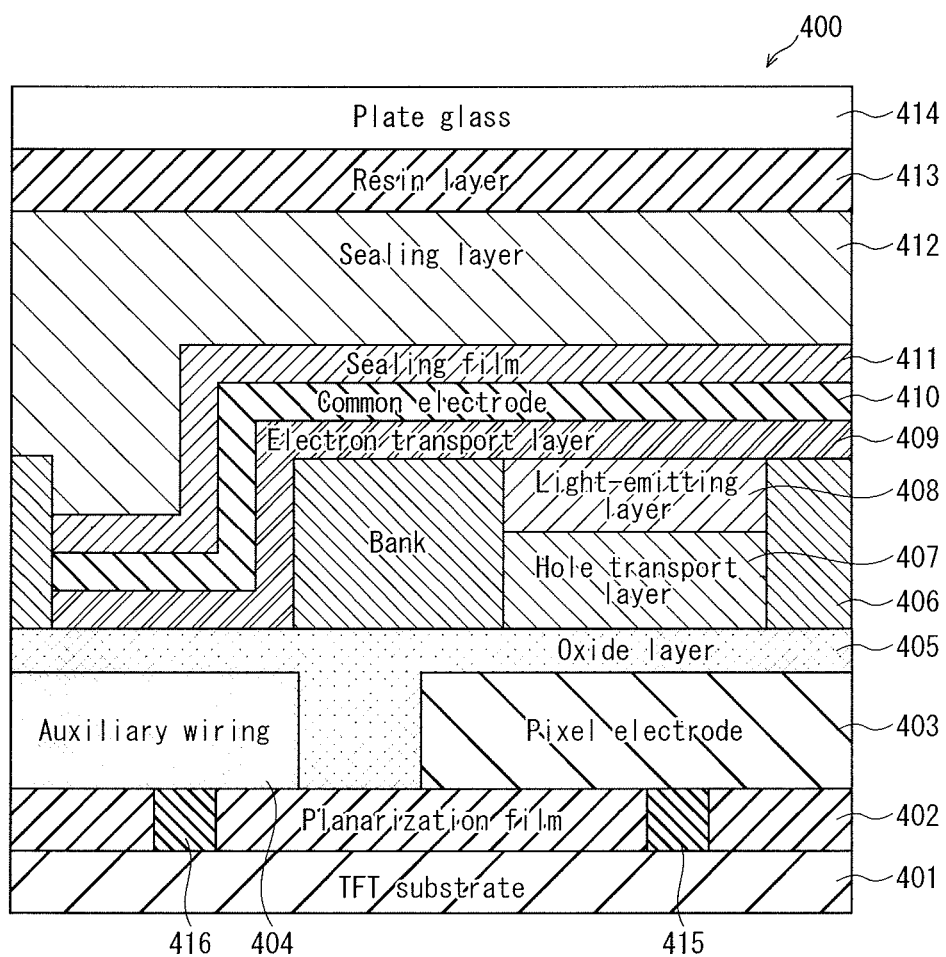
FIG. 20 is a cross-sectional diagram showing the overall configuration of the device pertaining to an aspect of the disclosure.

FIG. 19 is a process diagram of a manufacturing method for a device pertaining to an aspect of the disclosure. FIG. 20 is a cross-sectional diagram showing the overall configuration of a device pertaining to an aspect of the disclosure.

As shown in FIGS. 19 and 20, the device manufacturing method pertaining to an aspect of the disclosure first involves preparing a TFT substrate 401 and applying a passivation process to a surface thereof (step S11).

Next, for instance, patterning is applied to the TFT substrate 401 by forming a resin film through a spin coat method and applying photo-resist (PR) or photo-etching (PE), thus forming a planarization film 402 (step S12).

Then, for example, an ACL layer is formed over the planarization film 402 by sputtering, followed by patterning by PR or PE. A metallic layer is then formed in a matrix along with an IZO layer formed by vacuum deposition, patterning by PR or PE is applied, a metallic oxide layer is laminated thereon, and the two-layer structure of the metal layer and the metallic oxide layer results in formation of a pixel electrode 403 and auxiliary wiring 404 (step S13).

Afterward, for example, a solid film connecting the top of the pixel electrode 403 and the top of the auxiliary wiring 404 is formed by sputtering, thus forming an oxide layer 405 (step S14). Additionally, for instance, a bank 406 is formed as a planar lattice over the oxide layer 405.

Next, the landing accuracy inspection process is performed in accordance with the inspection method for the solution discharge device pertaining to present disclosure, prior to formation of a hole transport layer 407 as a functional layer (step S15). The inspection method for the solution discharge device is as described above. Then, adjustments to the solution discharge device are performed when a predetermined passing standard of landing accuracy has not been met.

The adjustments to the solution discharge device may include adjusting the position of the discharge outlets 124d, at discharge time when the landing position is offset, adjusting the discharge volume from the discharge outlets 124d, when the ink volume is inappropriate, increasing the discharge volume from neighbouring discharge outlets 124d, when invalid discharges have occurred, and making the discharge outlets 124d, more precise when extreme offsets or discharge fluctuations have occurred.

The discharge outlets 124d, are made more precise by, for example, using a known purge process, flushing process, wiping process, or similar approach. Also, a process may performed such that the voltage applied to the voltage elements 124a by the discharge controller 125 is modified to increase or decrease the amount of ink that is dripped. Alternatively, the inkjet head 122 may be replaced upon reaching the end of usable life. Also, an ink adjustment method may be applied to adjust at least one of ink density, ink viscosity, and ink composition.

Subsequently, ink that includes material for the hole transport layer 407 fills a defined area within the bank 406, dries as a printed film, and undergoes a baking process, thus forming the hole transport layer 407 (step S16).

Next, the landing accuracy inspection process is performed in accordance with the inspection method for the solution discharge device pertaining to present disclosure, prior to formation of a light-emitting layer 408 as a functional layer (step S17). Adjustments to the solution discharge device may be performed as described above when the inspection method for the solution discharge device or a predetermined standard of landing accuracy is not satisfied.

Then, an inkjet method is used to fill a defined area within the bank 406 over the hole transport layer 407 with ink that includes material for an organic light-emitting layer, dries as a printed film, and undergoes a baking process, thus forming the light-emitting layer 408 (step S18).

Next, for example, an electron transport layer 409 is formed by vacuum deposition as a solid film of organic material containing 10, wt % of barium, over the oxide layer 405 above the auxiliary wiring 404 and over the light-emitting layer 108 above the pixel electrode 403 so as to connect these two areas (step S19).

Then, for example, a solid film of metallic barium is formed over the electron transport layer 409 by vacuum deposition, thus forming a common electrode 410 (step S20).

Afterward, for example, a solid film of metallic barium is formed by vacuum deposition over the common electrode 410, and natural oxidation of the metallic barium layer results in formation of a sealing film 411 from the barium oxide (step S21).

Next, a sealing layer 412 is formed over the common electrode 410 using CVD (step S22).

A resin sealing material is then applied and irradiated with UV rays to cure the resin sealing material and form a resin layer 413 (step S23). A plate glass 414 is then disposed thereon (step S24). A device 400 is thus completed according to the above process.

In the Embodiments, the inspection method for the solution discharge device is performed before the formation of the functional layers, namely the hole transport layer 407 and the light-emitting layer 408. However, no such limitation to the timing of the inspection for the solution discharge device is intended, provided that the method is applied at least once before the formation of any functional layer using the inkjet method.

INDUSTRIAL APPLICABILITY

The inspection method for the solution discharge device pertaining to an aspect of the disclosure is widely applicable to passive-matrix and active-matrix organic light-emitting elements, as well as to the filed of manufacturing devices such as TFT substrates.

REFERENCE SIGNS LIST

100 Solution discharge device
124d, Discharge outlet
200 Discharge target

210 Surface
211 Inspection area
223, 323, 333 Target position
300 Device
307, 308 Functional layer
311, 312 Inspection area
$I_1$-$I_{15}$, Imaging area

The invention claimed is:

1. A device manufacturing method, comprising:
discharging a solution that includes a functional material from a plurality of discharge outlets of a solution discharge device onto a functional layer formation target; and forming a functional layer by drying the solution deposited on the functional layer formation target, wherein
prior to forming the functional layer, an inspection process for the solution discharge device, inspecting landing accuracy of drops respectively discharged onto a discharge target from each of the plurality of discharge outlets of the solution discharge device is executed, the inspection process including:
discharging the drops from the discharge outlets causing the drops to be deposited in an inspection area on a surface of the discharge target;
imaging a plurality of imaging areas into which the inspection area has been divided, each of the imaging areas being imaged at an imaging time that differs for each of the imaging areas, and acquiring an image of one or more deposits within each of the imaging areas, including a drop deposit;
reading a deposit surface area for each of the deposits, based on the image; judging, in each of the imaging areas, one among deposits found to have a deposit surface area falling within a deposit surface area standard as being a main drop; and
evaluating the landing accuracy according to the image showing the deposit judged as being the main drop, wherein
an upper bound and a lower bound of the deposit surface area standard are set in accordance with the imaging time, bound values applied to the deposit in one of the imaging areas that is imaged at a second imaging time being smaller than the values applied to the deposit in another one of the imaging areas that is imaged at a first imaging time, the second imaging time being later than the first imaging time, and
an adjustment to the solution discharge device is applied when the landing accuracy set as a passing condition is not satisfied.

2. The device manufacturing method according to claim 1, wherein
a difference between the upper bound and the lower bound of the deposit surface area standard is set to be smaller when applied to the deposit in the one of the imaging areas that is imaged at the second imaging time relative to when applied to the deposit in the other one of the imaging areas that is imaged at the first imaging time.

3. The device manufacturing method according to claim 1, wherein
the judging involves selecting a subset of deposits in each of the imaging areas, creating an approximant based on the deposit surface area of each deposit in the subset of deposits, with respect to a tendency of the deposit surface area to decrease over time, and setting the upper bound and the lower bound of the deposit surface area standard in accordance with the approximant.

4. The device manufacturing method according to claim 1, wherein
a respective target position is displayed on the inspection area in correspondence with each of the discharge outlets,
the discharging involves discharging the drops from the discharge outlets toward the respective target position,
the reading involves reading a displacement of each deposit relative to the respective target position, based on the image, and
the judging involves, for each of the imaging areas, judging one among deposits found to have a deposit surface area falling within the deposit surface area standard and found to have a displacement falling within a displacement standard as being the main drop.

5. The device manufacturing method according to claim 1, wherein
a respective target position is displayed on the inspection area in correspondence with each of the discharge outlets,
the discharging involves discharging the drops from the discharge outlets toward the respective target position,
the reading involves reading a displacement of each deposit relative to the respective target position, based on the image, and
the judging involves, for each of the imaging areas, judging one among deposits found to have a deposit surface area falling within the deposit surface area standard and found to have a minimal displacement as being the main drop.

6. The device manufacturing method according to claim 1, wherein
the inspection area is subdivided into a plurality of neighboring sub-divisions, each of the sub-divisions displaying a respective target position in correspondence with one of the discharge outlets, and
the discharging involves discharging the drops from each of a pair of neighboring discharge outlets toward the respective target position displayed in one of the sub-divisions.

7. The device manufacturing method according to claim 1, wherein
when a plurality of deposits within one of the imaging areas are each found to have a deposit surface area falling within the deposit surface area standard, the judging involves applying pattern matching to said deposits to judge the main drop.

* * * * *